US012727251B2

(12) United States Patent
Park et al.

(10) Patent No.: US 12,727,251 B2

(45) Date of Patent: Sep. 1, 2026

(54) DISPLAY DEVICE

(71) Applicant: Samsung Display Co., LTD., Yongin-si (KR)

(72) Inventors: Jong Hwan Park, Yongin-si (KR); Ki Nyeng Kang, Yongin-si (KR); Jong Hwan Cha, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 446 days.

(21) Appl. No.: 18/456,410

(22) Filed: Aug. 25, 2023

(65) Prior Publication Data

US 2024/0120346 A1 Apr. 11, 2024

(30) Foreign Application Priority Data

Oct. 11, 2022 (KR) ........................ 10-2022-0130099
Feb. 15, 2023 (KR) ........................ 10-2023-0020097

(51) Int. Cl.
*H10D 86/60* (2025.01)
*H10D 86/40* (2025.01)
*H10W 90/00* (2026.01)

(52) U.S. Cl.
CPC ........... *H10D 86/60* (2025.01); *H10D 86/441* (2025.01); *H10W 90/00* (2026.01)

(58) Field of Classification Search
CPC ...... H10D 86/60; H10D 86/441; H10W 90/00
USPC ........................................................... 257/72
See application file for complete search history.

(56) References Cited

U.S. PATENT DOCUMENTS

2023/0014863 A1* 1/2023 Kim ..................... H10D 86/441
2023/0163138 A1* 5/2023 Shin ...................... H10D 86/60 257/88

FOREIGN PATENT DOCUMENTS

KR 10-0299686 B1 10/2001
KR 10-2021-0046118 A 4/2021
KR 10-2022-0012966 A 2/2022

* cited by examiner

*Primary Examiner* — Igwe U Anya

(74) *Attorney, Agent, or Firm* — Womble Bond Dickinson (US) LLP

(57) ABSTRACT

A display device includes a display area, a non-display area, a pixel circuit including a thin film transistor, a gate driver in the non-display area for supplying a gate signal to the pixel circuit, a via layer above the pixel circuit and the gate driver, first and second electrodes above the via layer in the display area, and extending substantially in parallel with each other, a light-emitting element between the first electrode and the second electrode, a first contact electrode connected to one end of the light-emitting element, and a protective metal layer overlapping the gate driver, and including a first layer at a same layer as the first electrode and the second electrode, the first layer defining first holes, and a second layer at a same layer as the first contact electrode, at least partially filling the first holes, and contacting an upper surface of the via layer.

20 Claims, 18 Drawing Sheets

FIG. 7

MTL1: VL, VDL, VVSL
ACTL: DE, ACT, SE
MTL2: GE
MTL3: CE, ANE1, HVDL, VSL
MTL4: RME1, RME2
MTL5: CTE1, CTE2, CTE4, CTE5

MTL1: VL
ACTL: DE, ACT, SE
MTL2: GE
MTL3: CE1, CE2
MTL4: LAY1
MTL5: LAY2

MTL1: VL
ACTL: DE, ACT, SE
MTL2: GE
MTL3: CE1, CE2
MTL4: LAY1
MTL5: LAY2

DISPLAY DEVICE

CROSS-REFERENCE TO RELATED APPLICATION

This application claims priority to, and the benefit of, Korean Patent Application No. 10-2022-0130099 filed on Oct. 11, 2022, and Korean Patent Application No. 10-2023-0020097 filed on Feb. 15, 2023, both filed in the Korean Intellectual Property Office, the contents of which in their entirety are herein incorporated by reference.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices, such as smartphones, digital cameras, laptop computers, navigation devices, and smart televisions. The display device may be a flat panel display device, such as a liquid crystal display device, a field emission display device and an organic light-emitting display device. Among the flat panel display devices, in the light-emitting display device, because each of pixels of a display panel includes a light-emitting element capable of emitting light by itself, an image can be displayed without a backlight unit providing light to the display panel. The light-emitting element may be an organic light-emitting diode using an organic material as a fluorescent material and an inorganic light-emitting diode using an inorganic material as a fluorescent material.

SUMMARY

Aspects of the present disclosure provide a display device capable of reducing or eliminating static electricity applied to a gate driver built into a display panel.

Aspects of the present disclosure provide a display device capable of reducing or preventing the likelihood of peeling or lifting between the organic layer and the protective metal layer during high-temperature deposition.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments, a display device includes a display area for displaying an image, a non-display area at least partially surrounding the display area, a pixel circuit in the display area, and including a thin film transistor, a gate driver in the non-display area for supplying a gate signal to the pixel circuit, a via layer above the pixel circuit and the gate driver, first and second electrodes above the via layer in the display area, and extending substantially in parallel with each other, a light-emitting element between the first electrode and the second electrode, a first contact electrode connected to one end of the light-emitting element, and a protective metal layer overlapping the gate driver, and including a first layer at a same layer as the first electrode and the second electrode, the first layer defining first holes, and a second layer at a same layer as the first contact electrode, at least partially filling the first holes, and contacting an upper surface of the via layer.

The display device may further include an insulating layer above the first layer of the protective metal layer, and defining second holes overlapping the first holes.

The second layer may at least partially fill the second holes, and is connected to the first layer.

The second layer may include a first portion extending in a first direction, and a second portion extending in a second direction crossing the first direction, wherein a crossing region of the first portion and the second portion overlaps one of the first holes.

The display device may further include a power connection line for supplying a power voltage to the second layer, wherein the second layer at least partially fills a contact hole passing through the via layer, and is connected to the power connection line.

The second layer may include first portions extending in a first direction, and second portions extending in a second direction crossing the first direction, and connected to first ends of the first portions and to second ends of the first portions opposite to the first ends.

The second portions may overlap respective portions of the first holes at a first side edge of the first layer and at a second side edge of the first layer, wherein the first portions of the second layer overlap other respective portions of the first holes.

The second layer may include a common electrode at least partially filling the first holes.

The second layer may include island electrodes electrically connected to each other through the first layer.

The display device may further include a power connection line for supplying a power voltage to the first layer, wherein the first layer at least partially fills a contact hole passing through the via layer, and is connected to the power connection line.

According to one or more embodiments, a display device includes a display area for displaying an image, a non-display area at least partially surrounding the display area, a pixel circuit in the display area, and including a thin film transistor, a gate driver in the non-display area for supplying a gate signal to the pixel circuit, a via layer above the pixel circuit and the gate driver, a first layer of a protective metal layer above the via layer overlapping the gate driver, and defining first holes, an insulating layer above the first layer of the protective metal layer, and defining second holes at least partially overlapping the first holes, and a second layer of the protective metal layer above the insulating layer, at least partially filling the second holes, connected to the first layer, at least partially filling the first holes, and contacting an upper surface of the via layer.

The first layer may include a reflective electrode, wherein the second layer includes a transparent electrode.

An area of one of the second holes may be greater than an area of one of the first holes in plan view.

The first and second layers of the protective metal layer may cover an entirety of portions of the upper surface of the via layer overlapping the gate driver.

The second layer may cover at least a portion of an upper surface of the first layer adjacent to the first hole, and may cover at least a portion of an upper surface of the insulating layer adjacent to the second hole.

According to one or more embodiments, a display device includes a display area including a pixel including a first transistor, a non-display area at least partially surrounding the display area, and including a gate driver for generating a gate signal, a first voltage line above a first metal layer for supplying a high potential voltage to the first transistor of the pixel, the first transistor including a drain electrode in an active layer of the first metal layer, and electrically connected to the first voltage line, an active region adjacent to the drain electrode, a source electrode adjacent to the active region, and a gate electrode in a second metal layer above the active layer, an anode connection electrode in a third metal layer above the second metal layer, and electrically connected to the source electrode of the first transistor, a first electrode and a second electrode in a fourth metal layer above the third metal layer, and extending substantially in parallel to each other, a light-emitting element between the first electrode and the second electrode, a first contact electrode in a fifth metal layer above the fourth metal layer, and connected to one end of the light-emitting element, and a protective metal layer overlapping the gate driver, and including a first layer in the fourth metal layer that defines first holes, and a second layer in the fifth metal layer that at least partially fills the first holes.

The display device may further include an insulating layer above the first layer of the protective metal layer, and defining second holes at least partially overlapping the first holes.

The second layer may at least partially fill the second holes, and is connected to the first layer.

An area of one of the second holes may be greater than an area of one of the first holes in plan view.

The display device may further include a power connection line in at least one of the first metal layer, the second metal layer, or the third metal layer for supplying a power voltage to the protective metal layer.

In the display device according to embodiments, the gate driver may be protected from static electricity by including a protective metal layer located on the gate driver to receive a low potential voltage.

In addition, in the display device according to embodiments, it is possible to discharge heat generated from an organic layer during high-temperature deposition, and to reduce or prevent the likelihood of peeling or lifting between the organic layer and the protective metal layer by including a first layer of the protective metal layer including a plurality of holes.

However, aspects according to the embodiments of the present disclosure are not limited to those exemplified above and various other aspects are incorporated herein.

BRIEF DESCRIPTION OF THE DRAWINGS

The above and other aspects of the present disclosure will become more apparent by describing in detail embodiments thereof with reference to the attached drawings, in which:

FIG. 7 is a schematic cross-sectional view of a display device according to one or more embodiments;

DETAILED DESCRIPTION

Figure 1:
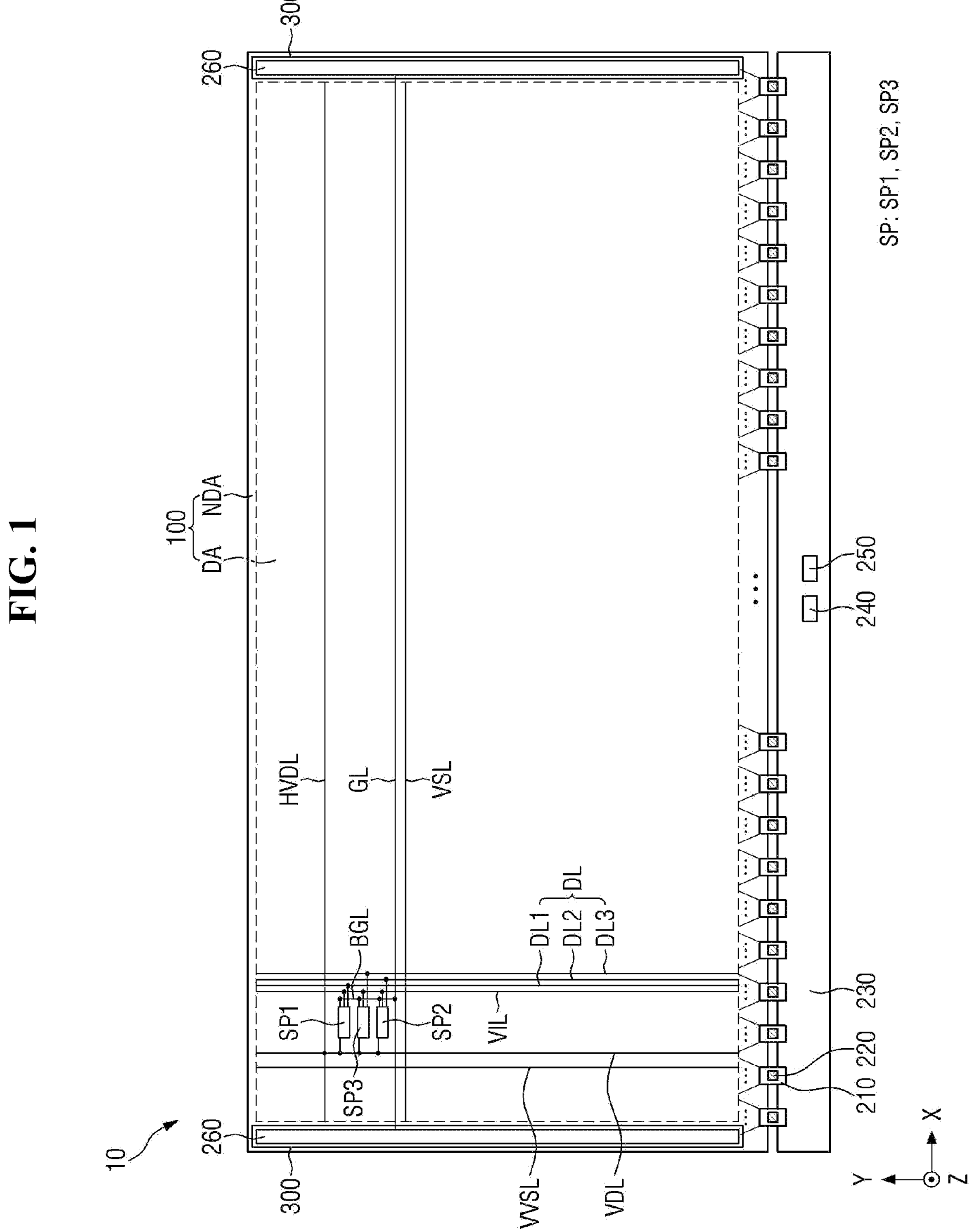
FIG. 1 is a plan view illustrating a display device according to one or more embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of one or more embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When one or more embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a plan view illustrating a display device according to one or more embodiments.

The terms "above," "top," and "top surface" as used herein refer to an upward direction (e.g., a Z-axis direction) with respect to the display device. The terms "below," "bottom," and "bottom surface" as used herein refer to a downward direction (e.g., a direction opposite to the Z-axis direction) with respect to the display device. Further, the terms "left," "right," "upper," and "lower" respectively indicate corresponding directions on the surface of the display device. For example, the term "left" may indicate a direction opposite to an X-axis direction, the term "right" may indicate the X-axis direction, the term "upper" may indicate a Y-axis direction, and the term "lower" may indicate a direction opposite to the Y-axis direction.

Referring to FIG. 1, a display device 10, as a device for displaying a moving or still image, may be employed as a display screen of various products, such as a television, a laptop computer, a monitor, a billboard, and an Internet of Things (IoT) device, as well as portable electronic devices, such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may include a display panel 100, a flexible film 210, a display driver 220, a circuit board 230, a timing controller 240, a power supply unit 250, a gate driver 260, and a protective metal layer 300.

The display panel 100 may have a rectangular shape in plan view. For example, the display panel 100 may have a rectangular shape, in plan view, having long sides in a first direction (X-axis direction), and short sides in a second direction (Y-axis direction). A corner formed by the long side in the first direction (X-axis direction) and the short side in the second direction (Y-axis direction) may be right-angled or rounded (e.g., with a predetermined curvature). The planar shape of the display panel 100 is not limited to the rectangular shape, and may be formed in another polygonal shape, a circular shape or an elliptical shape. For example, the display panel 100 may be formed to be flat, but is not limited thereto. In another example, the display panel 100 may be bent with a curvature (e.g., predetermined curvature).

The display panel 100 may include a display area DA and a non-display area NDA.

The display area DA, which is an area for displaying an image, may be defined as the central area of the display panel 100. The display area DA may include a pixel SP, a gate line GL, a data line DL, an initialization voltage line VIL, a first voltage line VDL, a horizontal voltage line HVDL, a vertical voltage line VVSL, and a second voltage line VSL. The pixels SP may be formed in each pixel area at crossing regions of the data lines DL and the gate lines GL. The pixels SP may include first to third pixels SP1, SP2, and SP3. Each of the first to third pixels SP1, SP2, and SP3 may be connected to one gate line GL and to one data line DL. Each of the first to third pixels SP1, SP2, and SP3 may be defined as a minimum unit area that outputs light.

Each of the first to third pixels SP1, SP2, and SP3 may include an organic light-emitting diode (OLED) having an organic light-emitting layer, a quantum dot light-emitting diode (LED) including a quantum dot light-emitting layer, a micro LED, or an inorganic LED having an inorganic semiconductor.

The first pixel SP1 may emit light of a first color, such as red light, the second pixel SP2 may emit light of a second color, such as green light, and the third pixel SP3 may emit light of a third color, such as blue light. The pixel circuits of the first pixel SP1, the third pixel SP3, and the second pixel SP2 may be arranged in the opposite direction of the second direction (Y-axis direction), but the arrangement direction of the pixel circuits is not limited thereto.

The gate lines GL may extend in the first direction (X-axis direction), and may be spaced apart from each other in the second direction (Y-axis direction). The gate line GL may receive a gate signal from the gate driver 260, and may supply the gate signal to an auxiliary gate line BGL. The auxiliary gate line BGL may extend from the gate line GL to supply gate signals to the first to third pixels SP1, SP2, and SP3.

The data lines DL may extend in the second direction (Y-axis direction), and may be spaced apart from each other in the first direction (X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The initialization voltage lines VIL may extend in the second direction (Y-axis direction), and may be spaced apart from each other in the first direction (X-axis direction). The initialization voltage line VIL may supply the initialization voltage received from the display driver 220 to the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal the display driver 220.

The first voltage lines VDL may extend in the second direction (Y-axis direction), and may be spaced apart from each other in the first direction (X-axis direction). The first voltage line VDL may supply a driving voltage or a high potential voltage received from a power supply unit 250 to the first to third pixels SP1, SP2, and SP3.

The horizontal voltage lines HVDL may extend in the first direction (X-axis direction), and may be spaced apart from each other in the second direction (Y-axis direction). The horizontal voltage line HVDL may be connected to the first voltage line VDL. The horizontal voltage line HVDL may receive a driving voltage or a high potential voltage to the first voltage line VDL.

The vertical voltage lines VVSL may extend in the second direction (Y-axis direction), and may be spaced apart from each other in the first direction (X-axis direction). The vertical voltage line VVSL may be connected to the second voltage line VSL. The vertical voltage line VVSL may supply a low potential voltage received from the power supply unit 250 to the second voltage line VSL.

The second voltage lines VSL may extend in the first direction (X-axis direction), and may be spaced apart from each other in the second direction (Y-axis direction). The second voltage line VSL may supply a low potential voltage to the first to third pixels SP1, SP2, and SP3.

The connection relationship between the pixel SP, the gate line GL, the data line DL, the initialization voltage line VIL, the first voltage line VDL, and the second voltage line VSL may be changed in design according to the number and arrangement of the pixels SP.

The non-display area NDA may be defined as the remaining area of the display panel 100 except the display area DA. For example, the non-display area NDA may include fan-out lines connecting the data line DL, the initialization voltage line VIL, the first voltage line VDL, and the vertical voltage line VVSL to the display driver 220, to the gate driver 260, and to a pad portion connected to the flexible film 210.

The flexible film 210 may be connected to the pad portion located on a lower side of the non-display area NDA. Input terminals provided on one side of the flexible film 210 may be attached to the circuit board 230 by a film-attaching process, and output terminals provided at the other side of the flexible film 210 may be attached to the pad portion by the film-attaching process. For example, the flexible film 210 may be bent, such as a tape carrier package or a chip on film. The flexible film 210 may be bent toward the lower portion of the display panel 100 to reduce a bezel area of the display device 10.

The display driver 220 may be mounted on the flexible film 210. For example, the display driver 220 may be implemented as an integrated circuit (IC). The display driver 220 may receive digital video data and a data control signal from the timing controller 240, and according to the data control signal, may convert the digital video data to an analog data voltage to supply the analog data voltage to the data lines DL through the fan-out lines.

The circuit board 230 may support a timing controller 240 and the power supply unit 250, and may supply signals and power to the display driver 220. For example, the circuit board 230 may supply a signal supplied from the timing controller 240, along with a power voltage supplied from the power supply unit 250, to the flexible film 210 and to the display driver 220 to display an image on each pixel. To this end, a signal line and a power line may be provided on the circuit board 230.

The timing controller 240 may be mounted on the circuit board 230, and may receive image data and a timing synchronization signal supplied from the display-driving system or a graphic device through a user connector provided on the circuit board 230. The timing controller 240 may generate digital video data by arranging the image data to fit the pixel arrangement structure based on the timing synchronization signal, and may supply the generated digital video data to the display driver 220. The timing controller 240 may generate the data control signal and a gate control signal based on the timing synchronization signal. The timing controller 240 may control the data voltage supply timing of the display driver 220 based on the data control signal, and may control the gate signal supply timing of the gate driver 260 based on the gate control signal.

The power supply unit 250 may be located on the circuit board 230 to supply a power voltage to the flexible film 210, the display driver 220, and the gate driver 260. For example, the power supply unit 250 may generate a driving voltage or a high potential voltage, and may supply it to the first voltage line VDL, may generate a low potential voltage, and may supply it to the vertical voltage line VVSL, and may generate an initialization voltage, and may supply it to the initialization voltage line VIL. The power supply unit 250 may generate a gate high voltage and a gate low voltage, and may supply the gate high voltage and the gate low voltage to the gate driver 260.

The gate drivers 260 may be located on the left and/or right sides of the non-display area NDA. The gate driver 260 may generate a gate signal based on a gate control signal supplied from the timing controller 240. The gate control signal may include a start signal, a clock signal, and a power voltage, but is not limited thereto. The gate driver 260 may supply gate signals to the gate lines GL according to a set order.

The protective metal layers 300 may be located on left and right sides of the non-display area NDA to overlap the gate driver 260. The protective metal layer 300 may be located on the gate driver 260 to protect the gate driver 260. The protective metal layer 300 may receive a power voltage from the power supply unit 250. For example, the protective metal layer 300 may receive a low potential voltage from the power supply unit 250 to reduce or eliminate static electricity applied from the outside.

Figure 2:
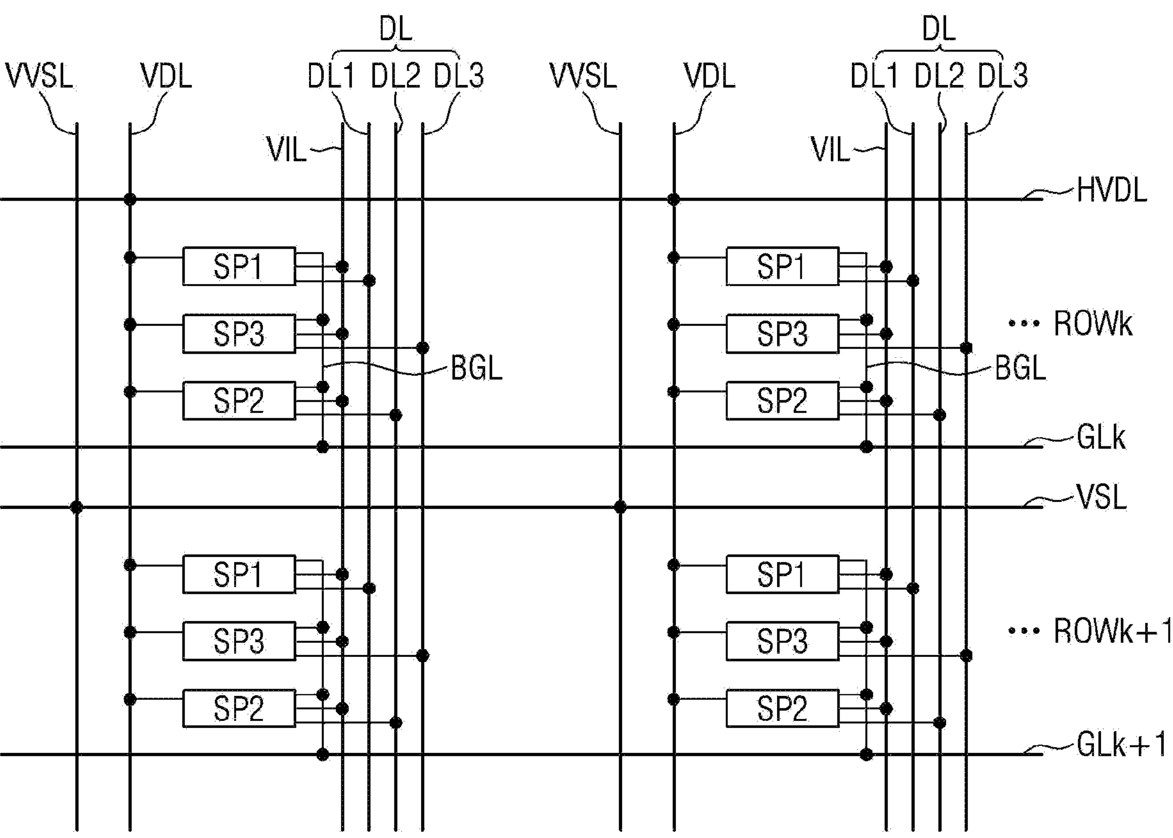
FIG. 2 is a diagram illustrating pixels and lines of a display device according to one or more embodiments.
Figure 2:
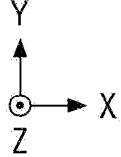

FIG. 2 is a diagram illustrating pixels and lines of a display device according to one or more embodiments.

Referring to FIG. 2, the pixels SP may include first to third pixels SP1, SP2, and SP3. The pixel circuits of the first pixel SP1, the third pixel SP3, and the second pixel SP2 may be arranged in the opposite direction of the second direction (Y-axis direction), but the arrangement direction of the pixel circuits is not limited thereto.

Each of the first to third pixels SP1, SP2, and SP3 may be connected to the first voltage line VDL, the initialization voltage line VIL, the gate line GL, and the data line DL.

The first voltage line VDL may extend in the second direction (Y-axis direction). The first voltage line VDL may be located on the left side of the pixel circuits of the first to third pixels SP1, SP2, and SP3. The first voltage line VDL may supply a driving voltage or a high potential voltage to a transistor of each of the first to third pixels SP1, SP2, and SP3.

The horizontal voltage line HVDL may extend in the first direction (X-axis direction). The horizontal voltage line HVDL may be located on the upper side of a pixel circuit of the first pixel SP1 located in a $k^{th}$ row ROWk (k being a positive integer). The horizontal voltage line HVDL may be connected to the first voltage line VDL. The horizontal voltage line HVDL may receive a driving voltage or a high potential voltage from the first voltage line VDL.

The vertical voltage line VVSL may extend in the second direction (Y-axis direction). The vertical voltage line VVSL may be located on the left side of the first voltage line VDL. The vertical voltage line VVSL may be connected between the power supply unit 250 and the second voltage line VSL. The vertical voltage line VVSL may supply the low potential voltage, which is supplied from the power supply unit 250, to the second voltage line VSL.

The second voltage line VSL may extend in the first direction (X-axis direction). The second voltage line VSL may be located above the pixel circuit of the first pixel SP1 located in a $(k+1)^{th}$ row ROWk+1. The second voltage line VSL may supply the low potential voltage received from the vertical voltage line VVSL to a light-emitting element layer of the first to third pixels SP1, SP2, and SP3.

The gate line GL may extend in the first direction (X-axis direction). The gate line GL may be located on the lower side of the pixel circuit of the corresponding second pixel SP2. The gate line GL may supply the gate signal received from the gate driver 260 to the auxiliary gate line BGL. For example, a $k^{th}$ gate line GLk may supply a gate signal to the pixels SP located in the $k^{th}$ row ROWk, and a $(k+1)^{th}$ gate line GLk+1 may supply a gate signal to the pixels SP located in the $(k+1)^{th}$ row ROWk+1.

The auxiliary gate lines BGL may extend from each of the gate lines GL in the second direction (Y-axis direction). Each of the auxiliary gate lines BGL may be located on a right side of the pixel circuits of the first through third pixels SP1 through SP3. Each of the auxiliary gate lines BGL may supply a gate signal received from the gate line GL to the pixel circuits of the first through third pixels SP1 through SP3.

The initialization voltage line VIL may extend in the second direction (Y-axis direction). The initialization voltage line VIL may be located on the right side of the corresponding auxiliary gate line BGL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal the display driver 220.

The data lines DL may extend in the second direction (Y-axis direction). The data lines DL may supply a data voltage to the pixels SP. The data lines DL may include first to third data lines DL1, DL2, and DL3.

The first data line DL1 may extend in the second direction (Y-axis direction). The first data line DL1 may be located on the right side of the initialization voltage line VIL. The first data line DL1 may supply the data voltage received from the display driver 220 to the pixel circuit of the first pixel SP1.

The second data line DL2 may extend in the second direction (Y-axis direction). The second data line DL2 may be located on the right side of the corresponding first data line DL1. The second data line DL2 may supply the data voltage received from the display driver 220 to the pixel circuit of the second pixel SP2. The third data line DL3 may extend in the second direction (Y-axis direction).

The third data line DL3 may be located on the right side of the corresponding second data line DL2. The third data line DL3 may supply the data voltage received from the display driver 220 to the pixel circuit of the third pixel SP3.

Figure 3:
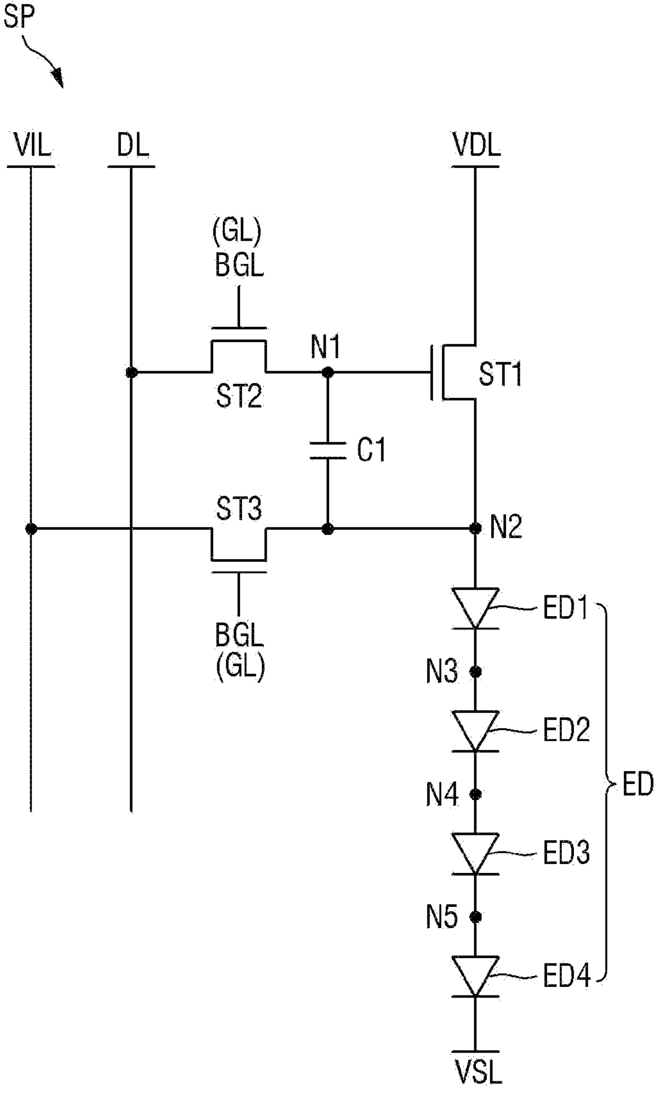
FIG. 3 is a circuit diagram illustrating a pixel of a display device according to one or more embodiments.

FIG. 3 is a circuit diagram illustrating a pixel of a display device according to one or more embodiments.

Referring to FIG. 3, each of the pixels SP may be connected to the first voltage line VDL, the data line DL, the initialization voltage line VIL, the gate line GL, and the second voltage line VSL.

Each of the first to third pixels SP1, SP2, and SP3 may include a pixel circuit and a plurality of light-emitting elements ED. The pixel circuit may include first to third transistors ST1, ST2, and ST3 and a first capacitor C1.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. The first transistor ST1 may control a drain-source current (or driving current) based on a data voltage applied to the gate electrode.

The light-emitting elements ED may include first to fourth light-emitting elements ED1, ED2, ED3, and ED4. The first to fourth light-emitting elements ED1, ED2, ED3, and ED4 may be connected in series. The first to fourth light-emitting elements ED1, ED2, ED3, and ED4 may receive a driving current to emit light. The light emission amount or the luminance of the light-emitting element ED may be proportional to the magnitude of the driving current. The light-emitting element ED may be an organic light-emitting diode (OLED) having an organic light-emitting layer, a quantum dot light-emitting diode (LED) including a quantum dot light-emitting layer, a micro LED, or an inorganic LED having an inorganic semiconductor.

The first electrode of the first light-emitting element ED1 may be connected to the second node N2, and the second electrode of the first light-emitting element ED1 may be connected to a third node N3. The first electrode of the first light-emitting element ED1 may be connected to the source electrode of the first transistor ST1, to a drain electrode of the third transistor ST3, and to a second capacitor electrode of the first capacitor C1 through the second node N2. The second electrode of the first light-emitting element ED1 may be connected to a first electrode of the second light-emitting element ED2 through the third node N3.

The first electrode of the second light-emitting element ED2 may be connected to the third node N3, and a second electrode of the second light-emitting element ED2 may be connected to a fourth node N4. A first electrode of the third light-emitting element ED3 may be connected to the fourth node N4, and a second electrode of the third light-emitting element ED3 may be connected to a fifth node N5. A first electrode of the fourth light-emitting element ED4 may be connected to the fifth node N5, and a second electrode of the fourth light-emitting element ED4 may be connected to the second voltage line VSL.

The second transistor ST2 may be turned on by the gate signal of the gate line GL to electrically connect the data line DL to the first node N1, which is the gate electrode of the first transistor ST1. The second transistor ST2 may be turned on according to the gate signal to supply the data voltage to the first node N1. A gate electrode of the second transistor ST2 may be connected to the gate line GL, a drain electrode thereof may be connected to the data line DL, and a source electrode thereof may be connected to the first node N1. The source electrode of the second transistor ST2 may be connected to the gate electrode of the first transistor ST1, and to a first capacitor electrode of the first capacitor C1 through the first node N1.

The third transistor ST3 may be turned on by the gate signal of the gate line GL to electrically connect the initialization voltage line VIL to the second node N2, which is the source electrode of the first transistor ST1. The third transistor ST3 may be turned on according to the gate signal to supply the initialization voltage to the second node N2. The third transistor ST3 may be turned on according to the gate signal to supply the sensing signal to the initialization voltage line VIL. A gate electrode of the third transistor ST3 may be connected to the gate line GL, a drain electrode thereof may be connected to the second node N2, and a source electrode thereof may be connected to the initialization voltage line VIL. The drain electrode of the third transistor ST3 may be connected to the source electrode of the first transistor ST1, to the second capacitor electrode of the first capacitor C1, and to the first electrode of the first light-emitting element ED1 through the second node N2.

Figure 4:
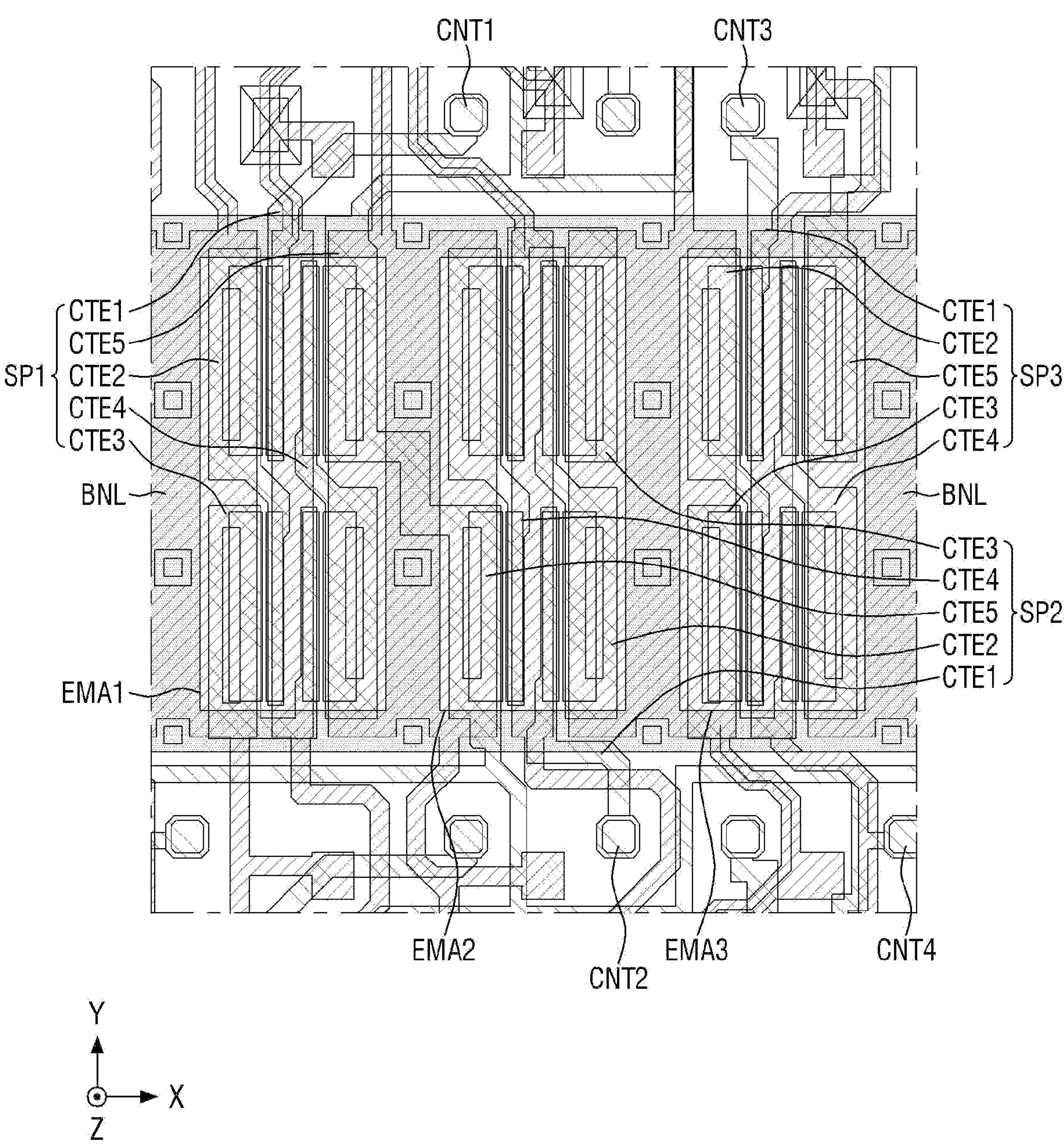
FIG. 4 is a plan view illustrating a light-emitting element layer of a display device according to one or more embodiments.
Figure 5:
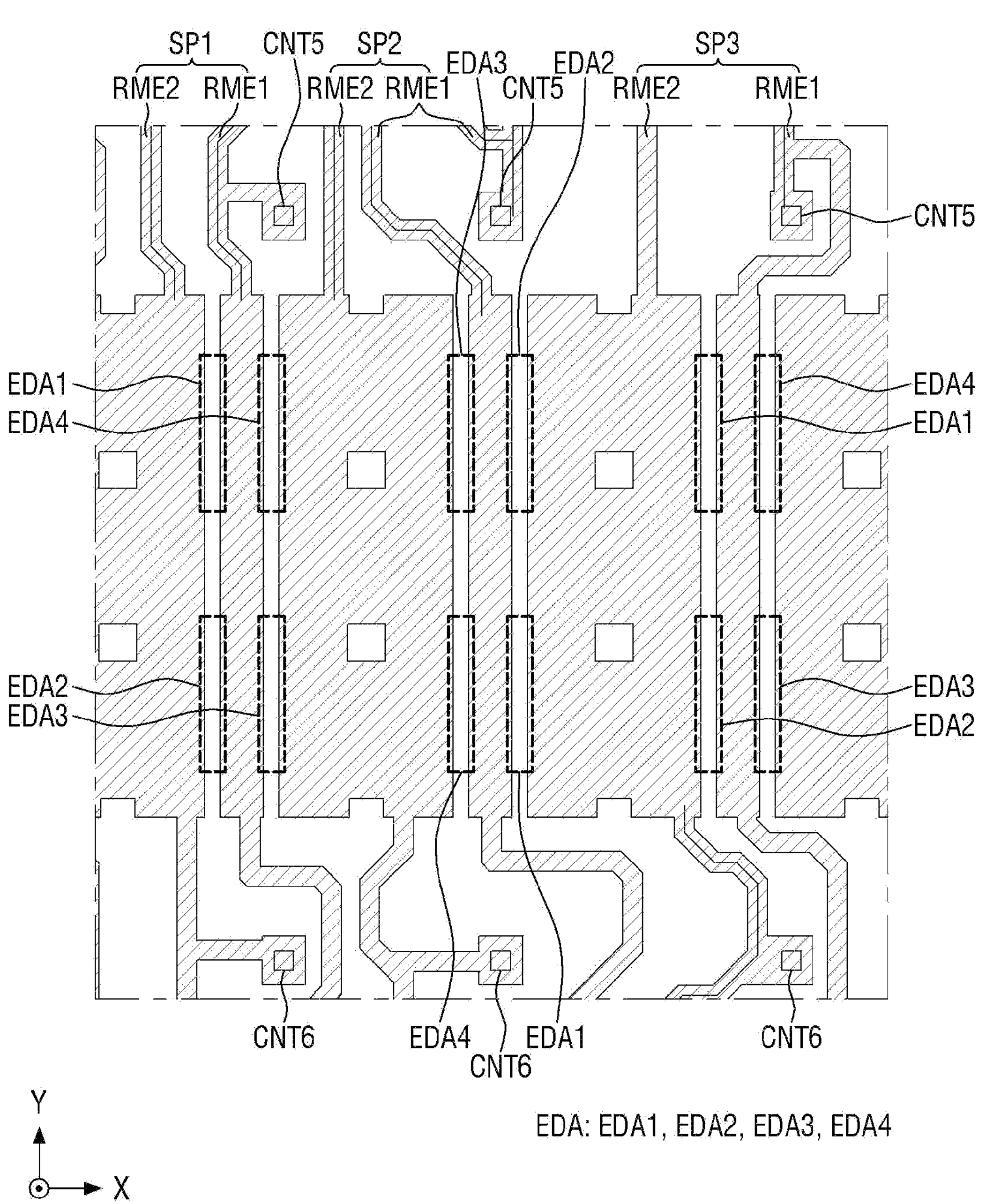
FIG. 5 is a plan view illustrating a fourth metal layer of a display device according to one or more embodiments.
Figure 6:
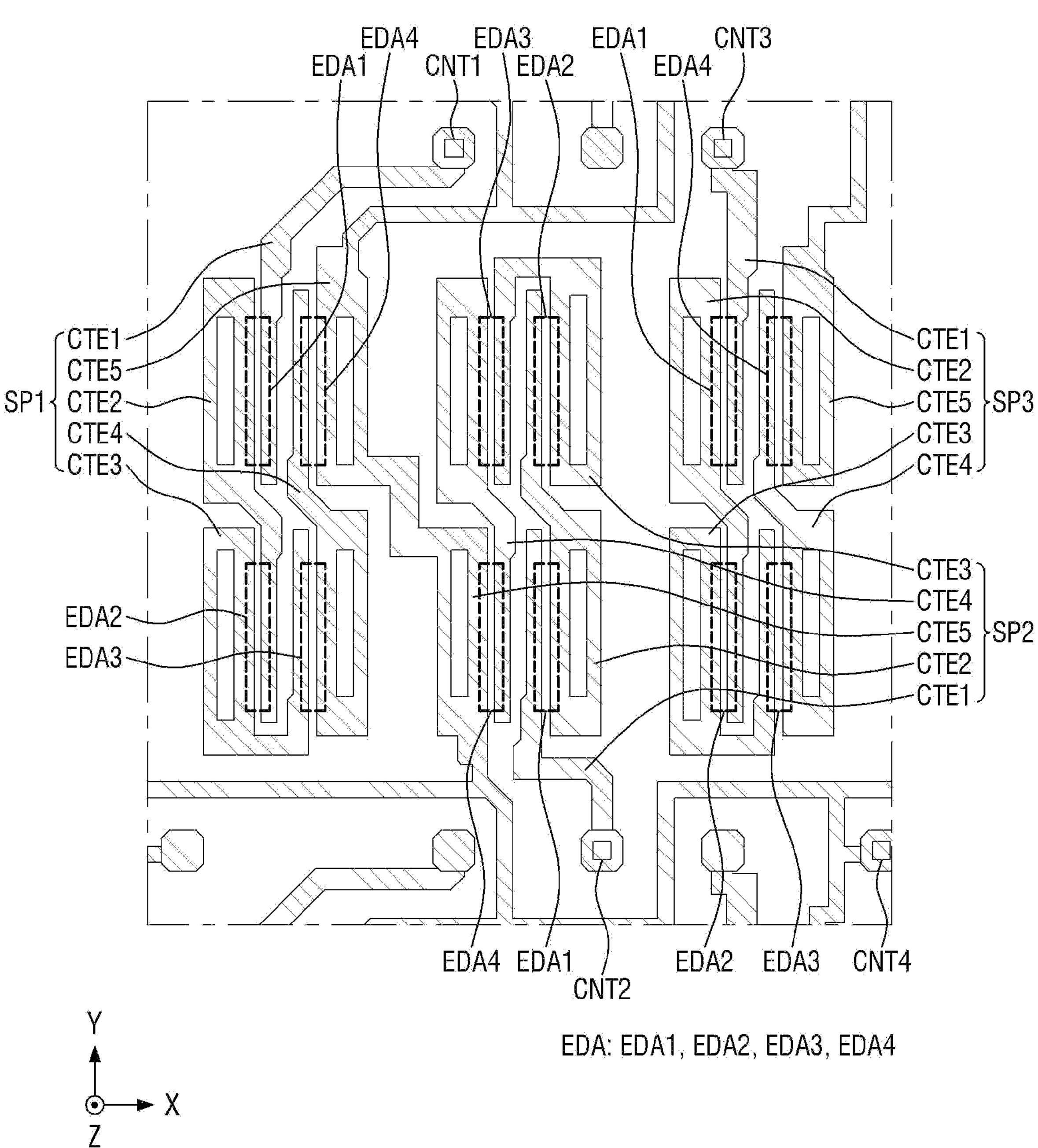
FIG. 6 is a plan view illustrating a fifth metal layer of a display device according to one or more embodiments.

FIG. 4 is a plan view illustrating a light-emitting element layer of a display device according to one or more embodiments, and FIG. 5 is a plan view illustrating a fourth metal layer of a display device according to one or more embodiments. FIG. 6 is a plan view illustrating a fifth metal layer of a display device according to one or more embodiments, and FIG. 7 is a schematic cross-sectional view of a display device according to one or more embodiments.

Referring to FIGS. 4 to 7, the display panel 100 may include a substrate SUB, a thin film transistor layer TFTL, and a light-emitting element layer EML.

Figure 7:
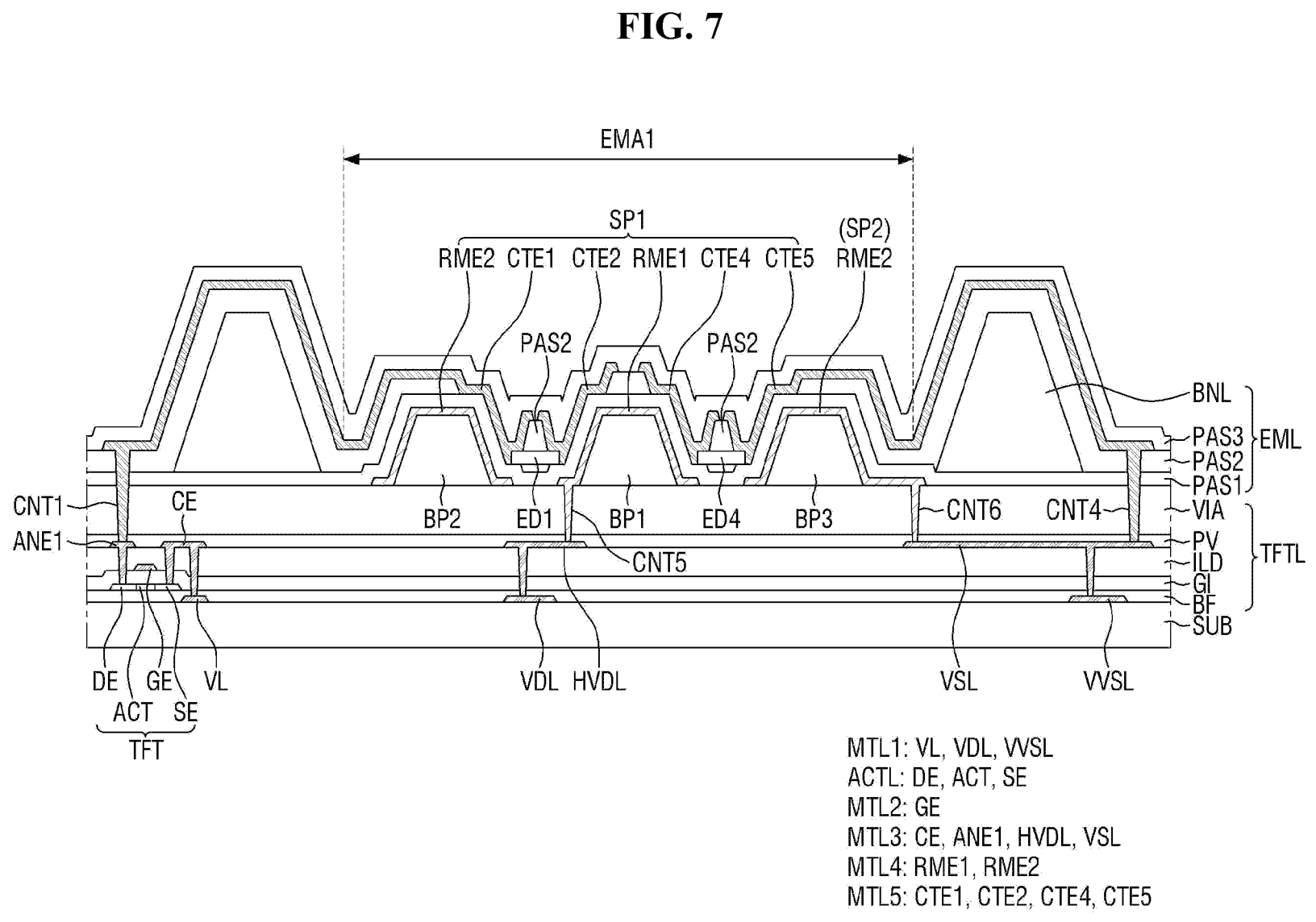

In FIG. 7, the substrate SUB may be a base substrate or a base member. The substrate SUB may be a flexible substrate that can be bent, folded, or rolled. For example, the substrate SUB may include a glass material or a metal material, but is not limited thereto. In one or more other embodiments, the substrate SUB may include a polymer resin, such as polyimide (PI).

The thin film transistor layer TFTL may be located on the substrate SUB. The thin film transistor layer TFTL may include a first metal layer MTL1, a buffer layer BF, an active layer ACTL, a gate-insulating layer GI, a second metal layer MTL2, an interlayer insulating layer ILD, a third metal layer MTL3, a protective layer PV, and a via layer VIA.

The first metal layer MTL1 may be located on the substrate SUB. The first metal layer MTL1 may include a voltage line VL, a first voltage line VDL, and a vertical voltage line VVSL. The voltage line VL may be a first voltage line VDL, an initialization voltage line VIL, or a data line DL.

The buffer layer BF may be located on the first metal layer MTL1. For example, the buffer layer BF may include an inorganic film capable of reducing or preventing penetration of air or moisture. For example, the buffer layer BF may include a plurality of inorganic layers alternately stacked.

The active layer ACTL may be located on the buffer layer BF. The active layer ACTL may include a drain electrode DE, a semiconductor region ACT, and a source electrode SE of a thin film transistor TFT. The thin film transistor TFT may be the first transistor ST1 of FIG. 3, but is not limited thereto. For example, the semiconductor region ACT of the thin film transistor TFT may include low temperature polycrystalline silicon (LTPS). The thin film transistor TFT including low temperature polycrystalline silicon may have high electron mobility and suitable turn-on characteristics. For another example, the semiconductor region ACT of the thin film transistor TFT may include oxide. The thin film transistor TFT including an oxide may have suitable leakage current characteristics, and may be driven at a relatively low frequency, thereby reducing power consumption.

The gate-insulating layer GI may be located on the active layer ACTL. The gate-insulating layer GI may insulate the active layer ACTL from the second metal layer MTL2.

The second metal layer MTL2 may be located on the gate-insulating layer GI. The second metal layer MTL2 may include a gate electrode GE of the thin film transistor TFT. The gate electrode GE of the thin film transistor TFT may overlap the semiconductor region ACT.

The interlayer insulating layer ILD may be located on the second metal layer MTL2. The interlayer insulating layer ILD may insulate the second metal layer MTL2 from the third metal layer MTL3 from each other.

The third metal layer MTL3 may be located on the interlayer insulating layer ILD. The third metal layer MTL3 may include a connection electrode CE, a first anode connection electrode ANE1, a horizontal voltage line HVDL, and a second voltage line VSL. The connection electrode CE may electrically connect the voltage line VL and the source electrode SE of the thin film transistor TFT. The first anode connection electrode ANE1 may electrically connect the drain electrode DE of the thin film transistor TFT and a first contact electrode CTE1. The horizontal voltage line HVDL may electrically connect the first voltage line VDL and a first electrode RME1. The second voltage line VSL may electrically connect the vertical voltage line VVSL and a second electrode RME2, and may electrically connect the vertical voltage line VVSL and a fifth contact electrode CTE5.

The protective layer PV may be located on the third metal layer MTL3. The protective layer PV may be located on the plurality of thin film transistors TFT to protect the pixel circuits of the pixels SP.

The via layer VIA may be located on the protective layer PV. The via layer VIA may planarize a top portion of the thin film transistor layer TFTL. The via layer VIA may include an organic insulating material, such as polyimide (PI).

The light-emitting element layer EML may be located on the thin film transistor layer TFTL. The light-emitting element layer EML may include first to third bank patterns BP1, BP2, and BP3, first and second electrodes RME1 and RME2, a first insulating layer PAS1, first to fourth light-emitting elements ED1, ED2, ED3, and ED4, a bank layer BNL, a second insulating layer PAS2, first to fifth contact electrodes CTE1, CTE2, CTE3, CTE4, and CTE5, and a third insulating layer PAS3.

The bank layer BNL may define first to third light-emitting areas EMA1, EMA2, and EMA3, as shown in FIG. 4. The light-emitting elements ED of the first pixel SP1 may be located in the first light-emitting area EMA1, the light-emitting elements ED of the second pixel SP2 may be located in the second light-emitting area EMA2, and the light-emitting elements ED of the third pixel SP3 may be located in the third light-emitting area EMA3. FIG. 7 is a schematic cross-sectional view of the first light-emitting area EMA1.

The first to third bank patterns BP1, BP2, and BP3 may extend in the second direction (Y-axis direction), and may be spaced apart from each other in the first direction (X-axis direction). The first bank pattern BP1 may be located between the second and third bank patterns BP2 and BP3. The second bank pattern BP2 may be located on the left side of the first bank pattern BP1, and the third bank pattern BP3 may be located on the right side of the first bank pattern BP1. Each of the first to third bank patterns BP1, BP2, and BP3 may protrude upwardly (Z-axis direction) on the via layer VIA. Each of the first to third bank patterns BP1, BP2, and BP3 may have an inclined side surface. The first and second light-emitting elements ED1 and ED2 of the first pixel SP1 may be located between the first and second bank patterns BP1 and BP2 spaced apart from each other. The third and fourth light-emitting elements ED3 and ED4 of the first pixel SP1 may be located between the first and third bank patterns BP1 and BP3 spaced apart from each other. The first to third bank patterns BP1, BP2, and BP3 may be arranged in an island pattern on an entirety of a surface of the display area DA.

In FIG. 5, the first and second electrodes RME1 and RME2 of each of the first to third pixels SP1, SP2, and SP3 may be located in a fourth metal layer MTL4. The maximum width of the second electrode RME2 in the first direction (X-axis direction) may be greater than the maximum width of the first electrode RME1 in the first direction (X-axis direction), but is not limited thereto. The fourth metal layer MTL4 may be located on the via layer VIA and on the first to third bank patterns BP1, BP2, and BP3. The first and second electrodes RME1 and RME2 of each of the first to third pixels SP1, SP2, and SP3 may extend in the second direction (Y-axis direction). The first electrode RME1 of the first pixel SP1 may be located between the second electrode RME2 of the first pixel SP1 and the second electrode RME2 of the second pixel SP2. The first electrode RME1 of the second pixel SP2 may be located between the second electrode RME2 of the second pixel SP2 and the second electrode RME2 of the third pixel SP3. The first electrode RME1 of the third pixel SP3 may be located on the right side of the second electrode RME2 of the third pixel SP3.

Each of the first and second electrodes RME1 and RME2 may cover a top surface and an inclined side surface of one of the first to third bank patterns BP1, BP2, and BP3. The first and second electrodes RME1 and RME2 may be reflective electrodes. The fourth metal layer MTL4 may be formed as a single layer or as multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu). The fourth metal layer MTL4 may include at least one layer comprising a material having high reflectivity. Accordingly, each of the first and second electrodes RME1 and RME2 may reflect light emitted from the first to fourth light-emitting elements ED1, ED2, ED3, and ED4 in the upward direction (Z-axis direction).

The first and second electrodes RME1 and RME2 may be alignment electrodes for aligning the first to fourth light-emitting elements ED1, ED2, ED3, and ED4 in the manufacturing process of the display device 10. The plurality of first electrodes RME1 may be connected to the horizontal voltage line HVDL of the third metal layer MTL3 through the plurality of fifth contact holes CNT5. The first electrode RME1 may receive a driving voltage or a high potential voltage from the horizontal voltage line HVDL. The plurality of second electrodes RME2 may be connected to the second voltage line VSL of the third metal layer MTL3 through a plurality of sixth contact holes CNT6. The second electrode RME2 may receive a low potential voltage from the second voltage line VSL.

The plurality of light-emitting elements ED may be aligned between the first electrode RME1 and the second electrode RME2. The plurality of light-emitting elements ED may be located in a light-emitting element area EDA. The plurality of first light-emitting elements ED1 may be located in a first light-emitting element area EDA1, the plurality of second light-emitting elements ED2 may be located in a second light-emitting element area EDA2, the plurality of third light-emitting elements ED3 may be located in a third light-emitting element area EDA3, and the plurality of fourth light-emitting elements ED4 may be located in a fourth light-emitting element area EDA4. The first and second light-emitting element areas EDA1 and EDA2 may be located between the first electrode RME1 of the first pixel SP1 and the second electrode RME2 of the first pixel SP1. The third and fourth light-emitting element areas EDA3 and EDA4 may be located between the first electrode RME1 of the first pixel SP1 and the second electrode RME2 of the second pixel SP2. The first insulating layer PAS1 may cover the first and second electrodes RME1 and RME2. The first insulating layer PAS1 may include an inorganic layer. The first to fourth light-emitting elements ED1, ED2, ED3, and ED4 may be insulated from the first and second electrodes RME1 and RME2 by the first insulating layer PAS1.

Each of the first and second electrodes RME1 and RME2 may receive an alignment signal, and an electric field may be formed between the first and second electrodes RME1 and RME2. For example, the plurality of first to fourth light-emitting elements ED1, ED2, ED3, and ED4 may be sprayed on the first and second electrodes RME1 and RME2 through an inkjet printing process, and the plurality of first to fourth light-emitting elements ED1, ED2, ED3, and ED4 dispersed in ink may be aligned by receiving a dielectrophoretic force by the electric field formed between the first and second electrodes RME1 and RME2. Accordingly, the plurality of first to fourth light-emitting elements ED1, ED2, ED3, and ED4 may be aligned in the second direction (Y-axis direction) between the first electrode and respective ones of the second electrodes RME1 and RME2.

In FIG. 6, the first to fifth contact electrodes CTE1, CTE2, CTE3, CTE4, and CTE5 of each of the first to third pixels SP1, SP2, and SP3 may be located in a fifth metal layer MTL5. The first to fifth contact electrodes CTE1, CTE2, CTE3, CTE4, and CTE5 may be transparent electrodes. For example, the fifth metal layer MTL5 may include a material, such as indium tin oxide (ITO), indium zinc oxide (IZO), and indium tin zinc oxide (ITZO). The fifth metal layer MTL5 may have a stacked structure of ITO/Ag/ITO, ITO/Ag/IZO, ITO/Ag/ITZO/IZO, or the like, but is not limited thereto.

The second insulating layer PAS2 may be located on the bank layer BNL, the first insulating layer PAS1, and the light-emitting element ED. The third insulating layer PAS3 may cover the second insulating layer PAS2 and the first to fifth contact electrodes CTE1, CTE2, CTE3, CTE4, and CTE5. The second and third insulating layers PAS2 and PAS3 may include an inorganic layer. The second and third insulating layers PAS2 and PAS3 may insulate each of the first to fifth contact electrodes CTE1, CTE2, CTE3, CTE4, and CTE5. Each of the second to fifth contact electrodes CTE2, CTE3, CTE4, and CTE5 may include an air gap located at the center, but the present disclosure is not limited thereto.

The first contact electrode CTE1 of the first pixel SP1 may be located on (e.g., above) the second electrode RME2 of the first pixel SP1, and may be connected to a first anode connection electrode ANE1 of a third metal layer MTL3 through the first contact hole CNT1. The first contact electrode CTE1 may be connected between the first anode connection electrode ANE1 and respective ends of the plurality of first light-emitting elements ED1. The first contact electrode CTE1 may receive a driving current passing through the first transistor ST1 of FIG. 3. The first contact electrode CTE1 may supply the driving current to the plurality of first light-emitting elements ED1 of the first pixel SP1. The first contact electrode CTE1 may correspond to an anode electrode of the plurality of first light-emitting elements ED1, but is not limited thereto.

The second contact electrode CTE2 may be insulated from the first and second electrodes RME1 and RME2. A first portion of the second contact electrode CTE2 may be located above the second electrode RME2 of the first pixel SP1 and extend in the second direction (Y-axis direction). A second portion of the second contact electrode CTE2 may extend from the lower side of the first portion thereof, and may be located above the first electrode RME1 of the first pixel SP1.

The second contact electrode CTE2 may be connected between the other respective ends of the plurality of first light-emitting elements ED1 and respective ends of the plurality of second light-emitting elements ED2. The second contact electrode CTE2 may correspond to the third node N3 of FIG. 3. The second contact electrode CTE2 may correspond to a cathode electrode of the plurality of first light-emitting elements ED1, but is not limited thereto. The second contact electrode CTE2 may correspond to an anode electrode of the plurality of second light-emitting elements ED2, but is not limited thereto.

The third contact electrode CTE3 may be insulated from the first and second electrodes RME1 and RME2. A first portion of the third contact electrode CTE3 may be located above the second electrode RME2 of the first pixel SP1, and may extend in the second direction (Y-axis direction). A second portion of the third contact electrode CTE3 may be located above the first electrode RME1 of the first pixel SP1, and may be located to the right side of the first portion thereof.

The third contact electrode CTE3 may be connected between other respective ends of the plurality of second light-emitting elements ED2 and respective ends of the plurality of third light-emitting elements ED3. The third contact electrode CTE3 may correspond to the fourth node N4 of FIG. 3. The third contact electrode CTE3 may correspond to a cathode electrode of the plurality of second light-emitting elements ED2, but is not limited thereto. The third contact electrode CTE3 may correspond to an anode electrode of the plurality of third light-emitting elements ED3, but is not limited thereto.

The fourth contact electrode CTE4 may be insulated from the first and second electrodes RME1 and RME2. A first portion of the fourth contact electrode CTE4 may be located above the second electrode RME2 of the second pixel SP2, and may extend in the second direction (Y-axis direction). A second portion of the fourth contact electrode CTE4 may extend from an upper side of the first portion thereof, and may be located on (e.g., above) the first electrode RME1 of the first pixel SP1.

The fourth contact electrode CTE4 may be connected between other respective ends of the plurality of third light-emitting elements ED3, and respective ends of the plurality of fourth light-emitting elements ED4. The fourth contact electrode CTE4 may correspond to the fifth node N5 of FIG. 3. The fourth contact electrode CTE4 may correspond to a cathode electrode of the plurality of third light-emitting elements ED3, but is not limited thereto. The fourth contact electrode CTE4 may correspond to an anode electrode of the plurality of fourth light-emitting elements ED4, but is not limited thereto.

The fifth contact electrode CTE5 may be connected between other respective ends of the plurality of fourth light-emitting elements ED4 and the second voltage line VSL. The fifth contact electrode CTE5 may be located on (e.g., above) the second electrode RME2 of the second pixel SP2, and may extend in the second direction (Y-axis direction). The fifth contact electrode CTE5 may be connected to the second voltage line VSL of the third metal layer MTL3 through a fourth contact hole CNT4. The fifth contact electrode CTE5 may correspond to the cathode electrode of the plurality of fourth light-emitting elements ED4, but is not limited thereto. The fifth contact electrode CTE5 may receive a low potential voltage through the second voltage line VSL. The fifth contact electrodes CTE5 of the first to third pixels SP1, SP2, and SP3 may be integrally formed, but are not limited thereto.

The first contact electrode CTE1 of the second pixel SP2 may be located on (e.g., above) the second electrode RME2 of the second pixel SP2, and may be connected to the pixel circuit of the second pixel SP2 through a second contact hole CNT2. The first contact electrode CTE1 may be connected between the pixel circuit of the second pixel SP2 and respective ends of the plurality of first light-emitting elements ED1. The first contact electrode CTE1 may receive a driving current passing through the first transistor ST1 of the second pixel SP2. The first contact electrode CTE1 may supply the driving current to the plurality of first light-emitting elements ED1 of the second pixel SP2.

The first contact electrode CTE1 of the third pixel SP3 may be located on the second electrode RME2 of the third pixel SP3, and may be connected to the pixel circuit of the third pixel SP3 through a third contact hole CNT3. The first contact electrode CTE1 may be connected between the pixel circuit of the third pixel SP3 and respective ends of the plurality of first light-emitting elements ED1. The first contact electrode CTE1 may receive a driving current passing through the first transistor ST1 of the third pixel SP3. The first contact electrode CTE1 may supply the driving current to the plurality of first light-emitting elements ED1 of the third pixel SP3.

Figure 8:
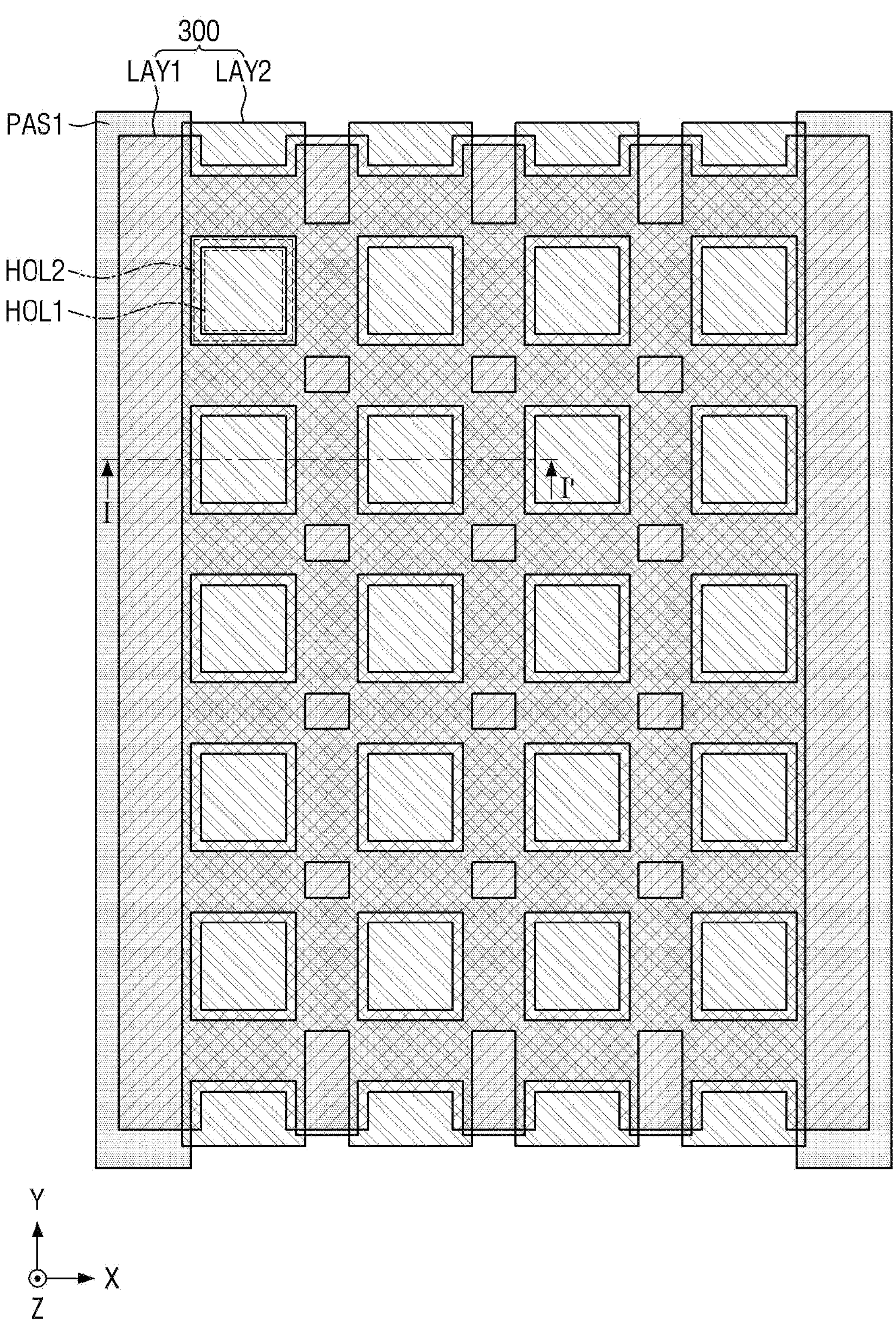
FIG. 8 is a plan view illustrating a protective metal layer of a display device according to one or more embodiments.
Figure 9:
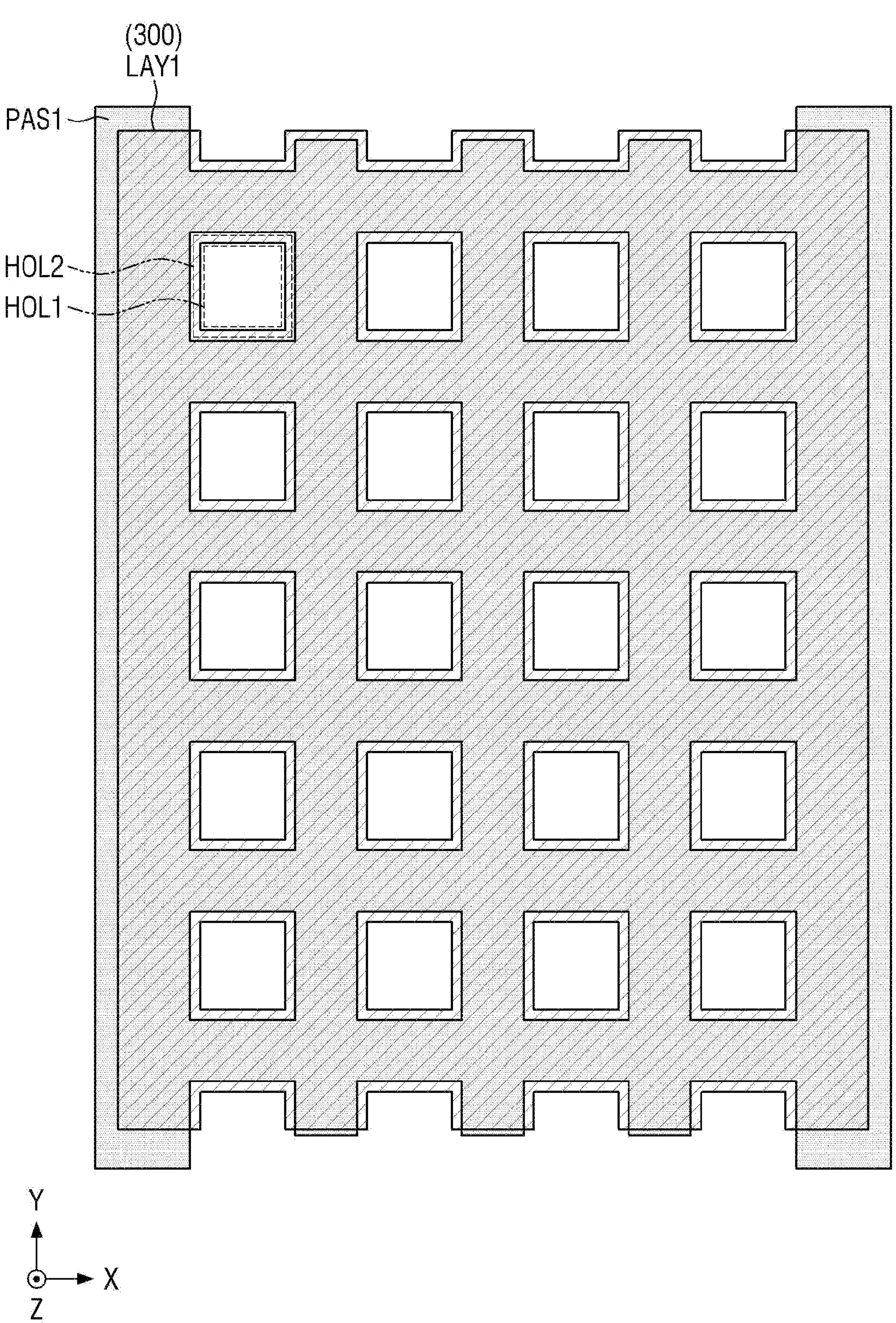
FIG. 9 is a plan view illustrating a first layer of a protective metal layer and a first insulating layer in a display device of FIG. 8.
Figure 10:
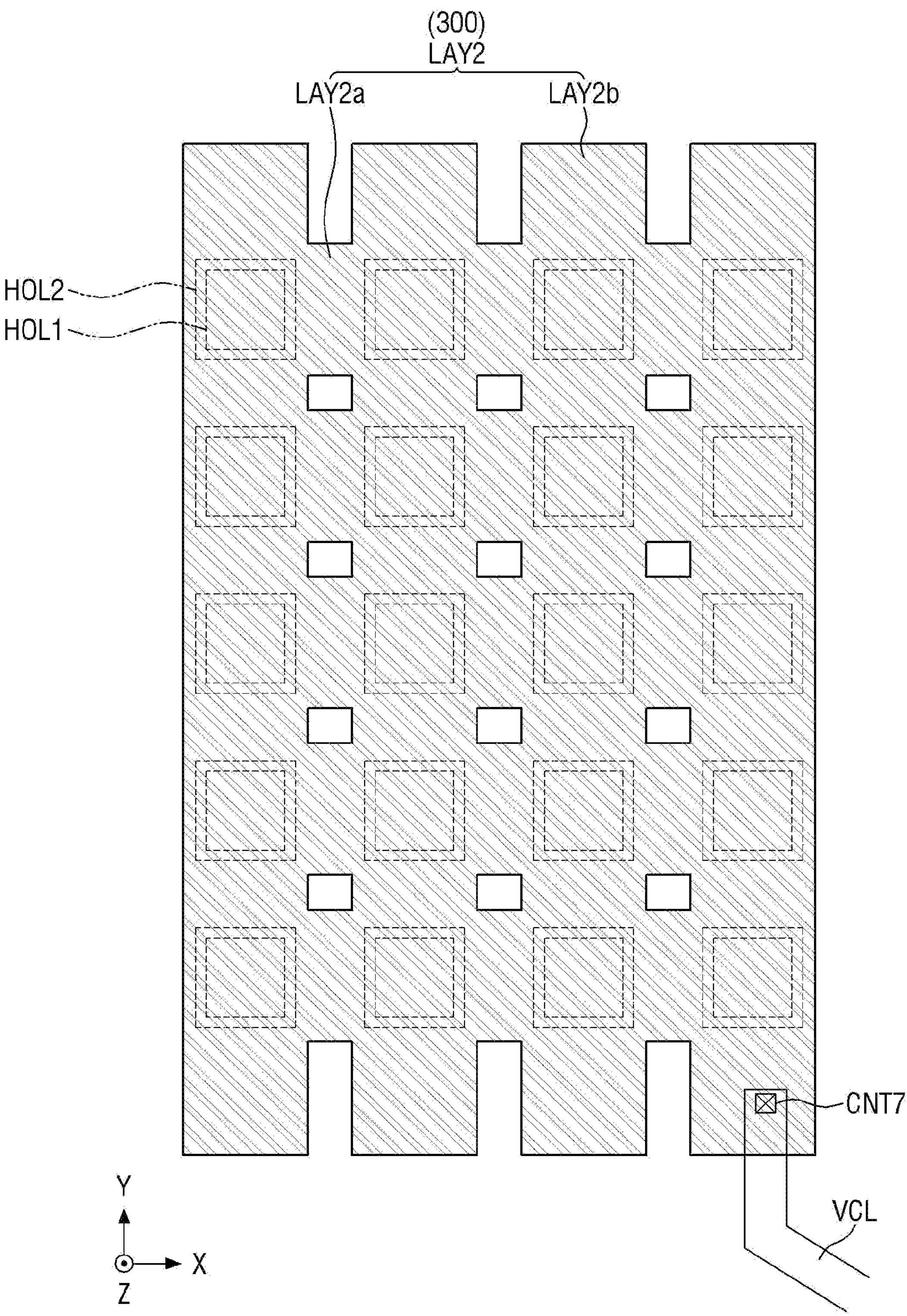
FIG. 10 is a plan view illustrating a second layer of a protective metal layer in a display device of FIG. 8.
Figure 11:
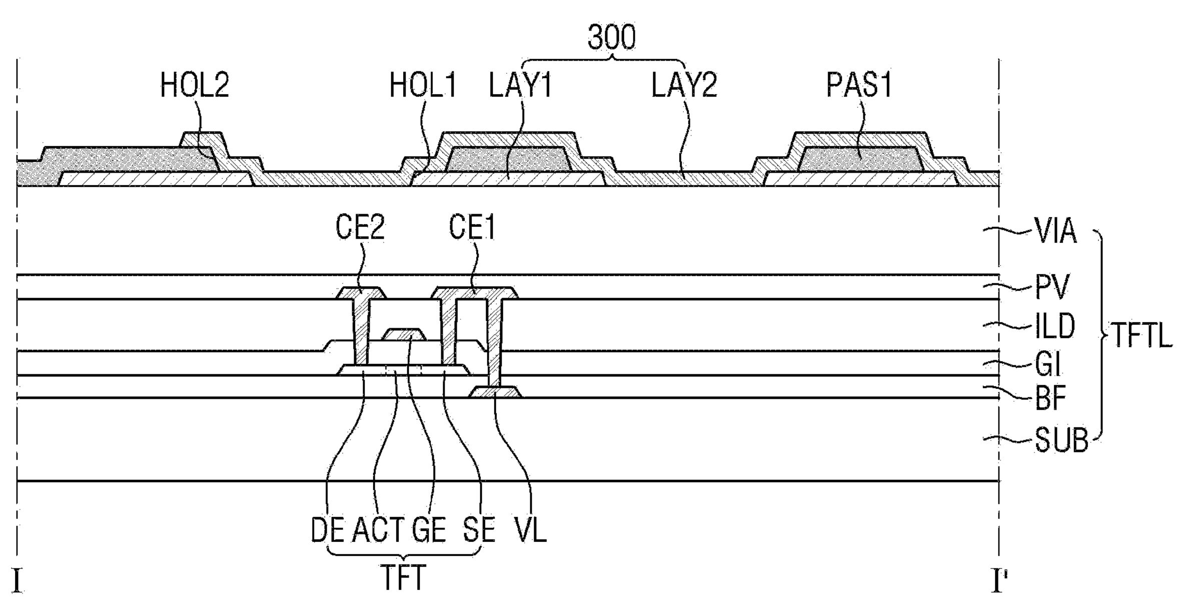
FIG. 11 is a cross-sectional view taken along the line I-I' of FIG. 8.

FIG. 8 is a plan view illustrating a protective metal layer of a display device according to one or more embodiments, and FIG. 9 is a plan view illustrating a first layer of a protective metal layer and a first insulating layer in a display device of FIG. 8. FIG. 10 is a plan view illustrating a second layer of a protective metal layer in a display device of FIG. 8, and FIG. 11 is a cross-sectional view taken along the line I-I' of FIG. 8.

Referring to FIGS. 8 to 11, the gate drivers 260 (e.g., see FIG. 1) may be located on the left and right sides of the non-display area NDA (e.g., see FIG. 1). The display device 10 may include a power line VL (e.g., see FIG. 1), a thin film transistor TFT, and first and second connection electrodes CE1 and CE2. The power line VL may be located in the first metal layer MTL1. The power line VL may be a start signal line, a clock line, a gate high voltage line, or a gate low voltage line, but is not limited thereto. The thin film transistor TFT may include a drain electrode DE, a semiconductor region ACT, and a source electrode SE located in the active layer ACTL, and a gate electrode GE located in the second metal layer MTL2. The first connection electrode CE1 may be located in the third metal layer MTL3 to electrically connect the power line VL to the source electrode SE of the thin film transistor TFT. The second connection electrode CE2 may be located in the third metal layer MTL3, and may be connected to a drain electrode DE of the thin film transistor TFT.

The gate driver 260 may generate a gate signal based on a gate control signal supplied from the timing controller 240 (e.g., see FIG. 1). The gate control signal may include a start signal, a clock signal, and a power voltage, but is not limited thereto. The gate driver 260 may supply gate signals to the gate lines GL according to a set order.

The protective metal layer 300 may be located on left and right sides of the non-display area NDA to overlap the gate driver 260. The protective metal layer 300 may be located on the gate driver 260 to protect the gate driver 260. The protective metal layer 300 may receive a power voltage from the power supply unit 250 (e.g., see FIG. 1). For example, the protective metal layer 300 may receive a low potential voltage from the power supply unit 250 to reduce or eliminate static electricity applied from the outside.

The protective metal layer 300 may include a first layer LAY1 and a second layer LAY2. The first layer LAY1 of the protective metal layer 300 may be located in the fourth metal layer MTL4. Accordingly, the first layer LAY1 of the protective metal layer 300 may be formed of the same material as the first and second electrodes RME1 and RME2 of the pixel SP, and may be formed in the same process. The first layer LAY1 of the protective metal layer 300 may have a mesh structure in which a plurality of first line patterns extending in the first direction (X-axis direction) and a plurality of second line patterns extending in the second direction (Y-axis direction) intersect each other. The first layer LAY1 of the protective metal layer 300 may cover one or more portions of the via layer VIA, and one or more other portions of the via layer VIA may be exposed by the first layer LAY1. Accordingly, the first layer LAY1 of the protective metal layer 300 may define a first hole HOL1, and the via layer VIA may be exposed through the first hole HOL1.

The first layer LAY1 of the protective metal layer 300 may include a reflective electrode. For example, the first layer LAY1 of the protective metal layer 300 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu). The first layer LAY1 may include at least one layer comprising a material having high reflectivity.

The first insulating layer PAS1 may be located on the first layer LAY1 of the protective metal layer 300. A width of the first insulating layer PAS1 on a plane may be less than a width of the first layer LAY1 on a plane. The first insulating layer PAS1 may cover one or more portions of the upper surface of the first layer LAY1, and may not cover one or more other portions of the upper surface of the first layer LAY1. The first insulating layer PAS1 may have a mesh structure, and may define a second hole HOL2. The second hole HOL2 of the first insulating layer PAS1 may overlap the first hole HOL1 of the first layer LAY1 (e.g., in plan view), and the area of the second hole HOL2 on a plane may be greater than an area of the first HOL1 on the plane. Accordingly, the first insulating layer PAS1 may not overlap the first hole HOL1, and one or more portions of the first layer LAY1 may be exposed through the second hole HOL2.

The light-emitting element layer EML of the display device 10 may be formed through a high-temperature deposition process. For example, the first to third insulating layers PAS1, PAS2, and PAS3 shown in FIG. 7 may include an inorganic layer and may be formed through a high-temperature deposition process. A via layer PAS may have a high-temperature state during the formation process of the inorganic layer, thereby discharging gas through the first and second holes HOL1 and HOL2. Because a part of the via layer VIA is exposed through the first hole HOL1 of the first layer LAY1 and the second hole HOL2 of the first insulating layer PAS1, it is possible to discharge heat generated from the via layer VIA, and to reduce or prevent the likelihood of peeling or lifting between the via layer VIA and the first layer LAY1 (e.g., separation of the via layer VIA from the first layer LAY1).

The second layer LAY2 of the protective metal layer 300 may be located in the fifth metal layer MTL5. Accordingly, the second layer LAY2 of the protective metal layer 300 may be formed of the same material as the first to fifth contact electrodes CTE1, CTE2, CTE3, CTE4, and CTE5 of the pixel SP, and may be formed in the same process. The second layer LAY2 of the protective metal layer 300 may have a mesh structure in which a plurality of first portions LAY2*a* extending in the first direction (X-axis direction) and a plurality of second portions LAY2*b* extending in the second direction (Y-axis direction) cross each other. An crossing region of the first and second portions LAY2*a* and LAY2*b* of the second layer LAY2 may overlap the first hole HOL1 and the second hole HOL2. The second layer LAY2 of the protective metal layer 300 may cover the first layer LAY1 and the first insulating layer PAS1. The second layer LAY2 of the protective metal layer 300 may completely cover the first hole HOL1 and the second hole HOL2. The second layer LAY2 may be inserted into (e.g., may fill) the second hole HOL2 of the first insulating layer PAS1, may be connected to the first layer LAY1, and may be inserted into (e.g., may fill) the first hole HOL1 of the first layer LAY1 to contact the upper surface of the via layer VIA. Accordingly, the protective metal layer 300 may cover the entire surface of the gate driver 260 through the first and second layers LAY1 and LAY2, and may protect the gate driver 260 from static electricity.

The second layer LAY2 of the protective metal layer 300 may be connected to a power connection line VCL through a seventh contact hole CNT7. Here, the seventh contact hole CNT7 may pass through at least the via layer VIA and the protective layer PV. The second layer LAY2 of the protective metal layer 300 may receive a power voltage through a power connection line VCL. For example, the second layer LAY2 may supply the low potential voltage received from the power connection line VCL to the first layer LAY1. The power connection line VCL may be located in at least one of the first to third metal layers MTL1, MTL2, or MTL3, but is not limited thereto.

The second layer LAY2 of the protective metal layer 300 may include a transparent electrode. For example, the second layer LAY2 of the protective metal layer 300 may include a material, such as indium tin oxide (ITO), indium zinc oxide (IZO), and/or indium tin zinc oxide (ITZO). The second layer LAY2 of the protective metal layer 300 may have a stacked structure of ITO/Ag/ITO, ITO/Ag/IZO, ITO/Ag/ITZO/IZO, or the like, but is not limited thereto.

Figure 12:
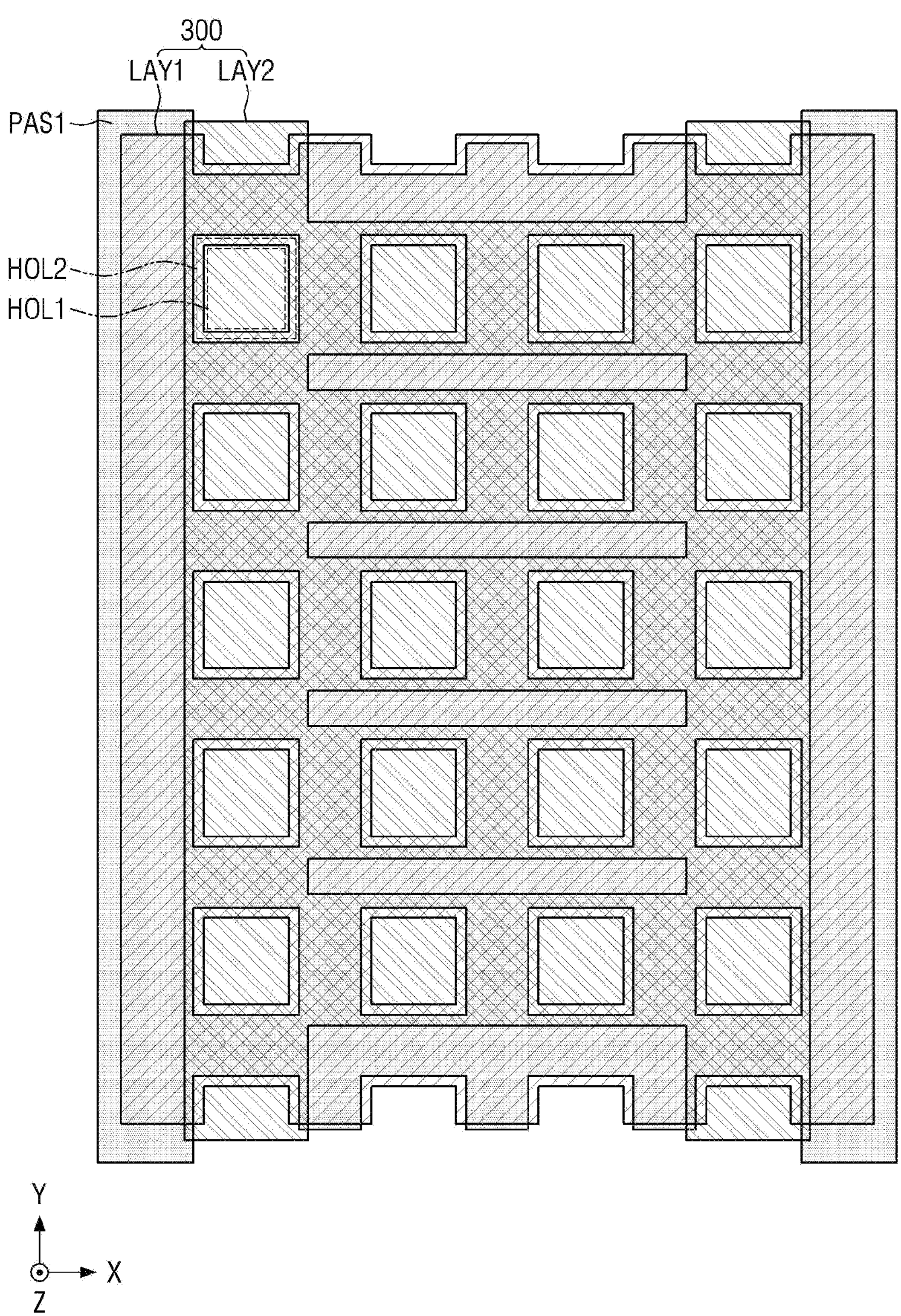
FIG. 12 is a plan view illustrating a protective metal layer of a display device according to one or more other embodiments.
Figure 13:
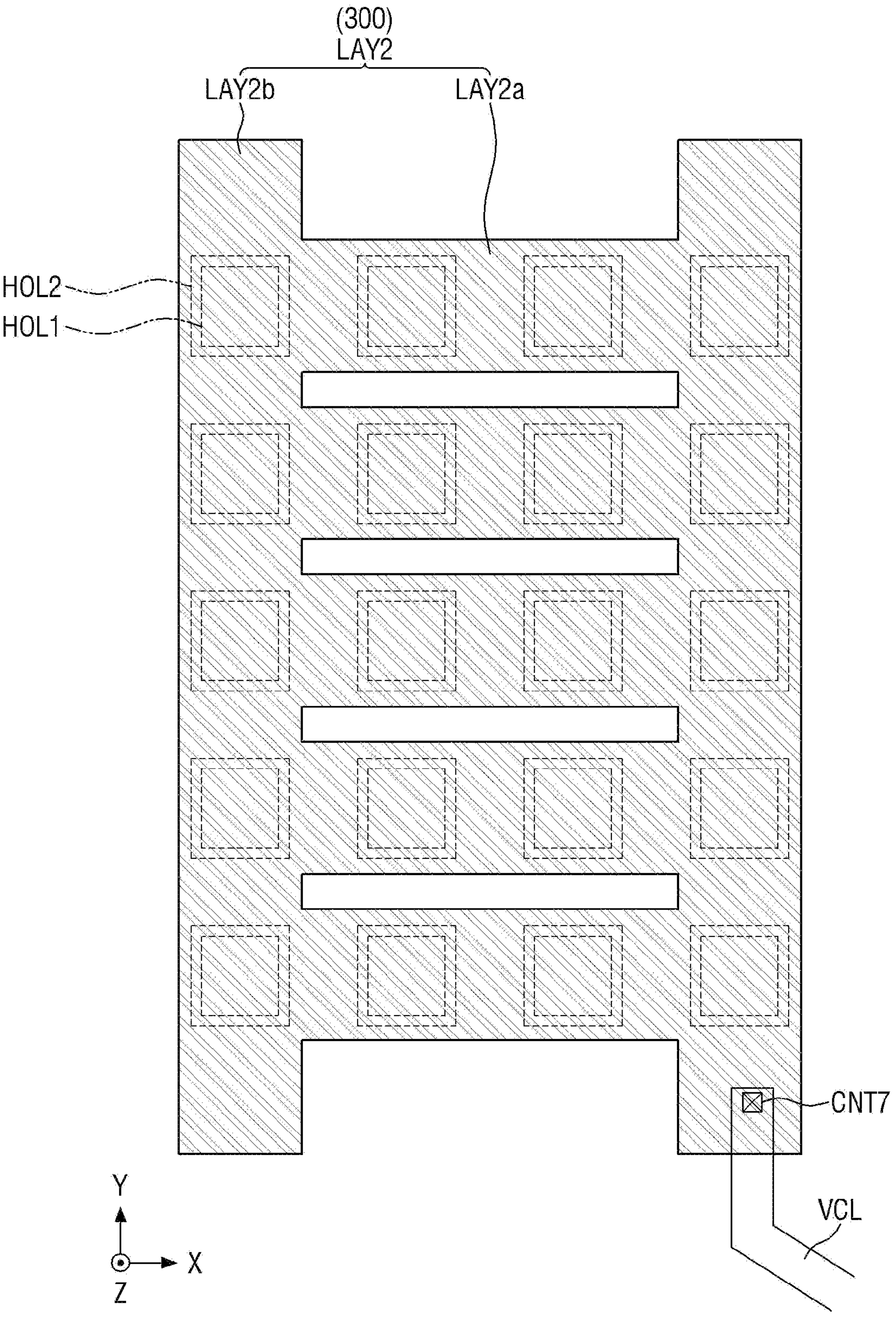
FIG. 13 is a plan view illustrating a second layer of a protective metal layer in a display device of FIG. 12.

FIG. 12 is a plan view illustrating a protective metal layer of a display device according to one or more other embodiments, and FIG. 13 is a plan view illustrating a second layer of a protective metal layer in a display device of FIG. 12. The display device shown in FIGS. 12 and 13 is different from the display device described above in the structure of the second layer LAY2 of the protective metal layer 300. The same configuration as the above-described configuration will be briefly described or omitted.

Referring to FIGS. 12 and 13, the protective metal layer 300 may include a first layer LAY1 and a second layer LAY2. The second layer LAY2 of the protective metal layer 300 may be located in the fifth metal layer MTL5. Accordingly, the second layer LAY2 of the protective metal layer 300 may be formed of the same material as the first to fifth contact electrodes CTE1, CTE2, CTE3, CTE4, and CTE5 of the pixel SP, and may be formed in the same process.

The second layer LAY2 of the protective metal layer 300 may include a plurality of first portions LAY2*a* extending in the first direction (X-axis direction) and a plurality of second portions LAY2*b* extending in the second direction (Y-axis direction). The second portions LAY2*b* of the second layer LAY2 may be located on the left and right edges of the protective metal layer 300, and the plurality of first portions LAY2*a* of the second layer LAY2 may electrically connect the second portions LAY2*b* thereof. The second portions LAY2*b* of the second layer LAY2 may be connected to left and right ends of the first portions LAY2*a*. The second portion LAY2*b* of the second layer LAY2 may overlap the first hole HOL1 and the second hole HOL2 located on the left and right edges of the protective metal layer 300, and the first portion LAY2*a* of the second layer LAY2 may overlap the first and second holes HOL1 and HOL2 located between the second portions LAY2*b*.

The second layer LAY2 of the protective metal layer 300 may cover the first layer LAY1 and the first insulating layer PAS1. The second layer LAY2 of the protective metal layer 300 may completely cover the first hole HOL1 and the second hole HOL2. The second layer LAY2 may be inserted into the second hole HOL2 of the first insulating layer PAS1, may be connected to the first layer LAY1, and may be inserted into the first hole HOL1 of the first layer LAY1 to be in contact with the upper surface of the via layer VIA. Accordingly, the protective metal layer 300 may cover the entire surface of the gate driver 260 through the first and second layers LAY1 and LAY2, and may protect the gate driver 260 from static electricity.

The second layer LAY2 of the protective metal layer 300 may be connected to the power connection line VCL through a seventh contact hole CNT7. Here, the seventh contact hole CNT7 may pass through at least the via layer VIA and the protective layer PV. The second layer LAY2 of the protective metal layer 300 may receive a power voltage through a power connection line VCL. For example, the second layer LAY2 may supply the low potential voltage received from the power connection line VCL to the first layer LAY1. The power connection line VCL may be located on at least one of the first to third metal layers MTL1, MTL2, or MTL3, but is not limited thereto.

Figure 14:
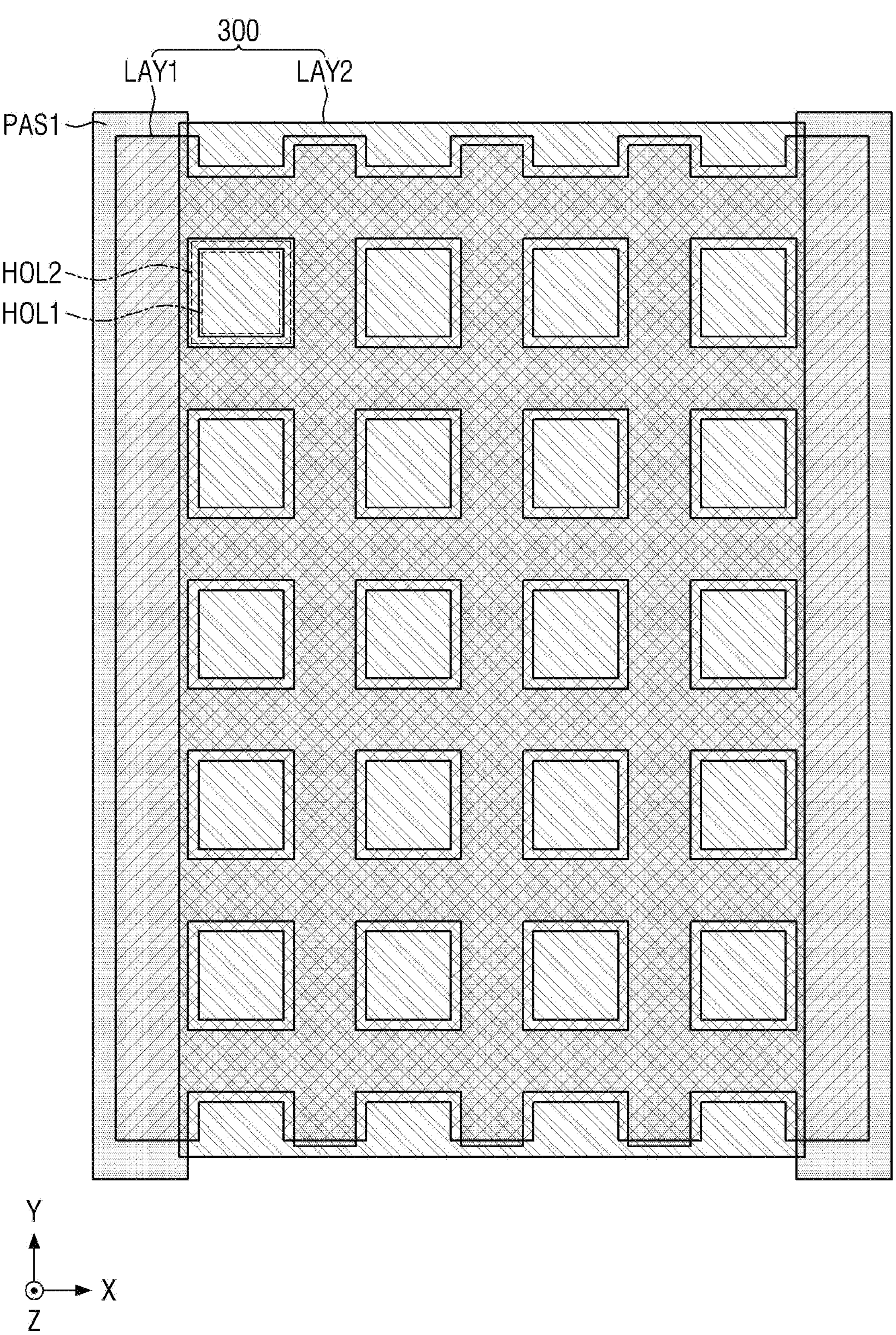
FIG. 14 is a plan view illustrating a protective metal layer of a display device according to one or more other embodiments.
Figure 15:
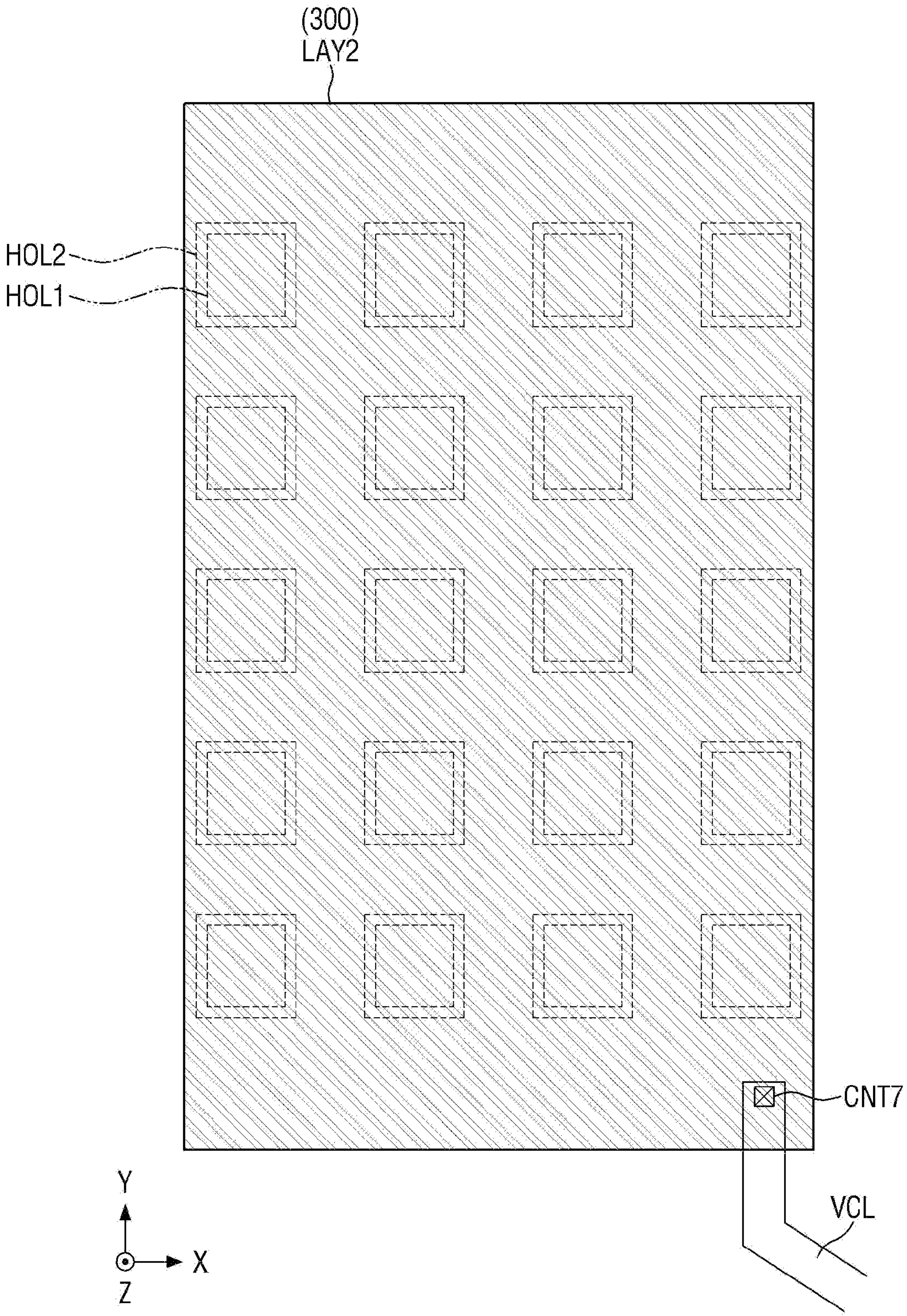
FIG. 15 is a plan view illustrating a second layer of a protective metal layer in a display device of FIG. 14.

FIG. 14 is a plan view illustrating a protective metal layer of a display device according to one or more other embodiments. FIG. 15 is a plan view illustrating a second layer of a protective metal layer in a display device of FIG. 14. The display device shown in FIGS. 14 and 15 is different from the display device described above in the structure of the second layer LAY2 of the protective metal layer 300. The same configuration as the above-described configuration will be briefly described or omitted.

Referring to FIGS. 14 and 15, the protective metal layer 300 may include a first layer LAY1 and a second layer LAY2. The second layer LAY2 of the protective metal layer 300 may be located in the fifth metal layer MTL5. Accordingly, the second layer LAY2 of the protective metal layer 300 may be formed of the same material as the first to fifth contact electrodes CTE1, CTE2, CTE3, CTE4, and CTE5 of the pixel SP in the same process.

The second layer LAY2 of the protective metal layer 300 may be a common electrode. The second layer LAY2 of the protective metal layer 300 may overlap the first hole HOL1 and the second hole HOL2. The second layer LAY2 of the protective metal layer 300 may cover the first layer LAY1 and the first insulating layer PAS1. The second layer LAY2 of the protective metal layer 300 may completely cover the first hole HOL1 and the second hole HOL2. The second layer LAY2 may be inserted into the second hole HOL2 of the first insulating layer PAS1, may be connected to the first layer LAY1, and may be inserted into the first hole HOL1 of the first layer LAY1 to be in contact with the upper surface of the via layer VIA. Accordingly, the protective metal layer 300 may cover the entire surface of the gate driver 260 through the first and second layers LAY1 and LAY2, and may protect the gate driver 260 from static electricity.

The second layer LAY2 of the protective metal layer 300 may be connected to the power connection line VCL through a seventh contact hole CNT7. Here, the seventh contact hole CNT7 may pass through at least the via layer VIA and the protective layer PV. The second layer LAY2 of the protective metal layer 300 may receive a power voltage through a power connection line VCL. For example, the second layer LAY2 may supply the low potential voltage received from the power connection line VCL to the first layer LAY1. The power connection line VCL may be located in at least one of the first to third metal layers MTL1, MTL2, or MTL3, but is not limited thereto.

Figure 16:
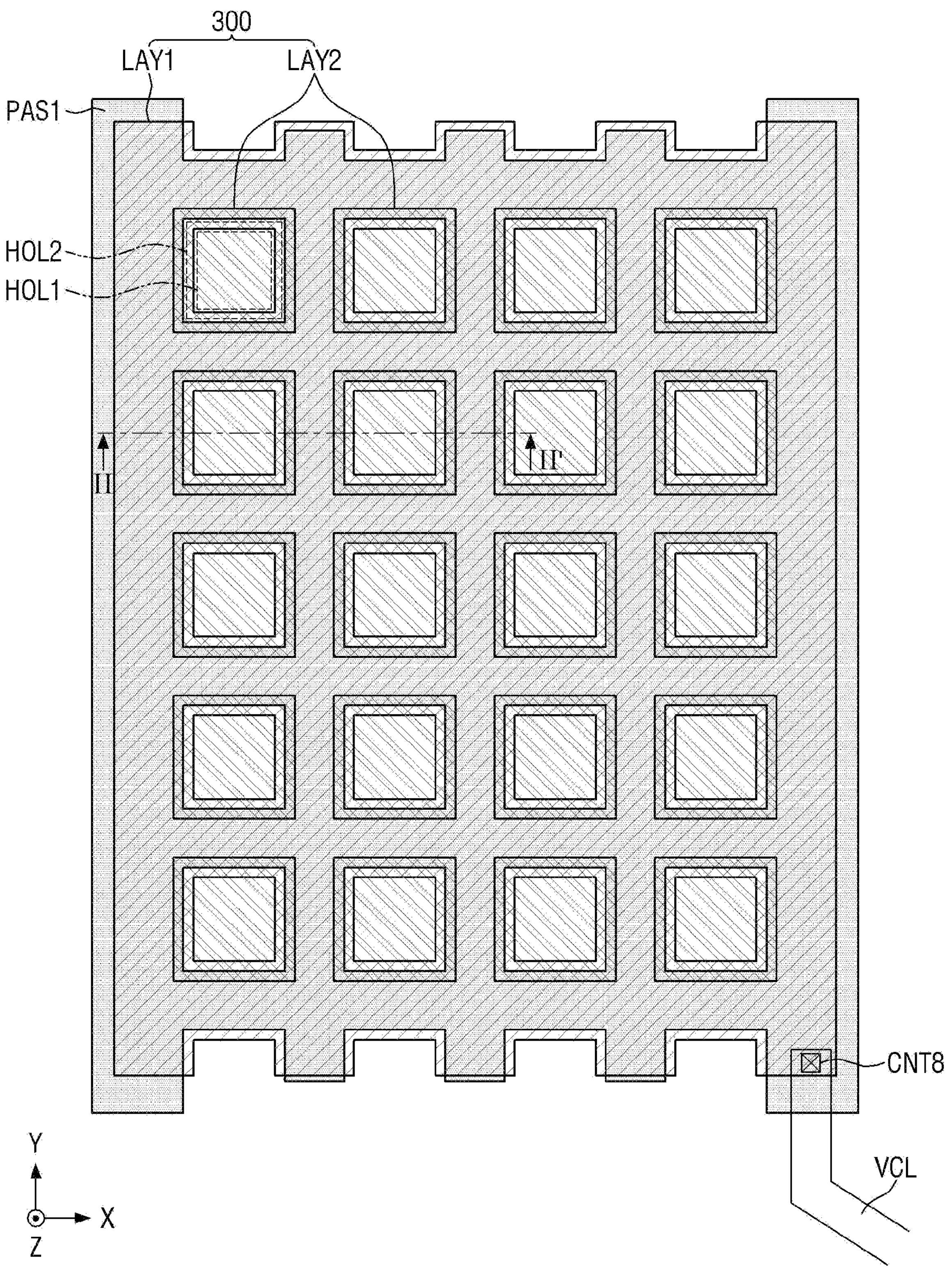
FIG. 16 is a plan view illustrating a protective metal layer of a display device according to yet one or more other embodiments.
Figure 17:
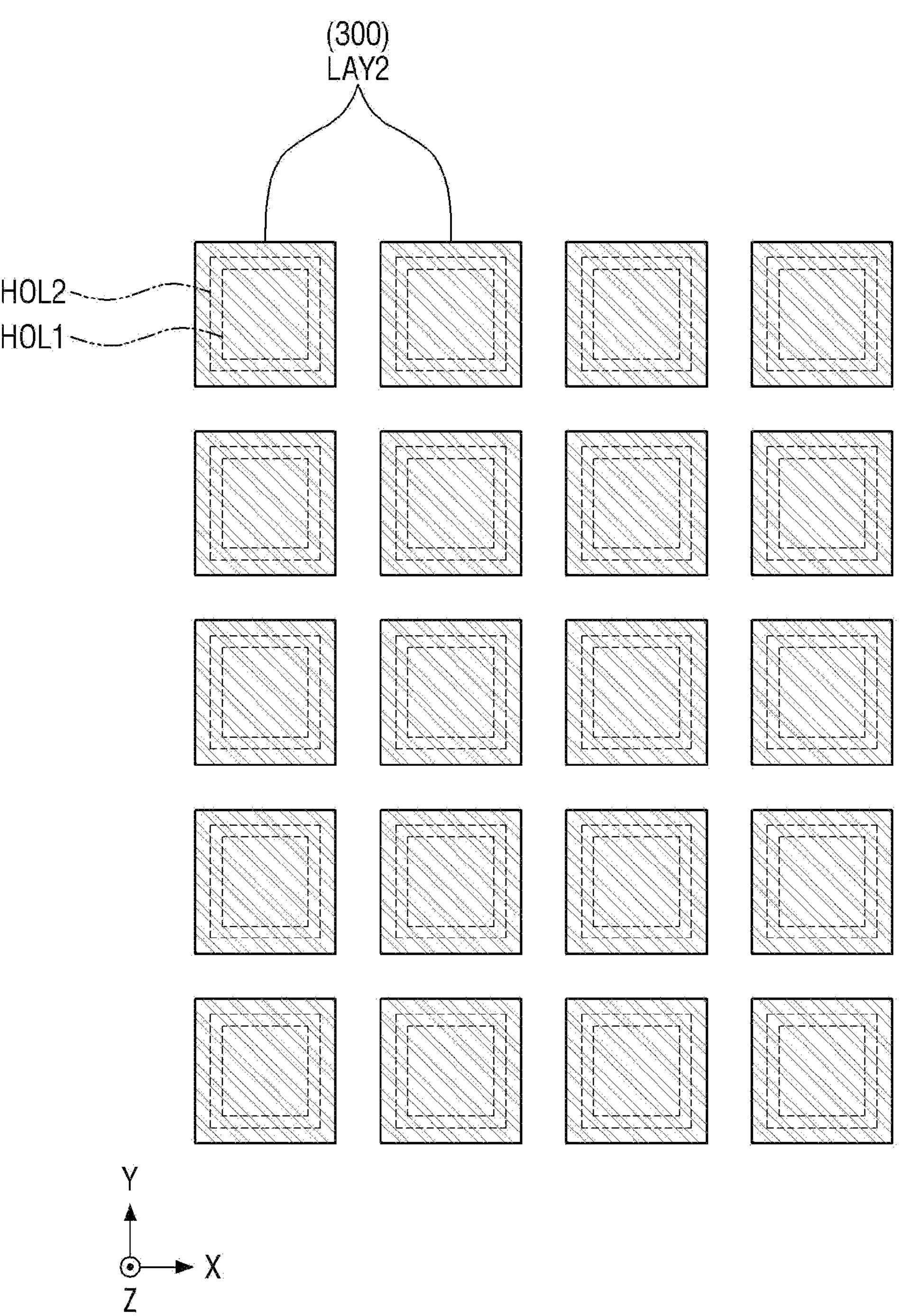
FIG. 17 is a plan view illustrating a second layer of a protective metal layer in a display device of FIG. 16.
Figure 18:
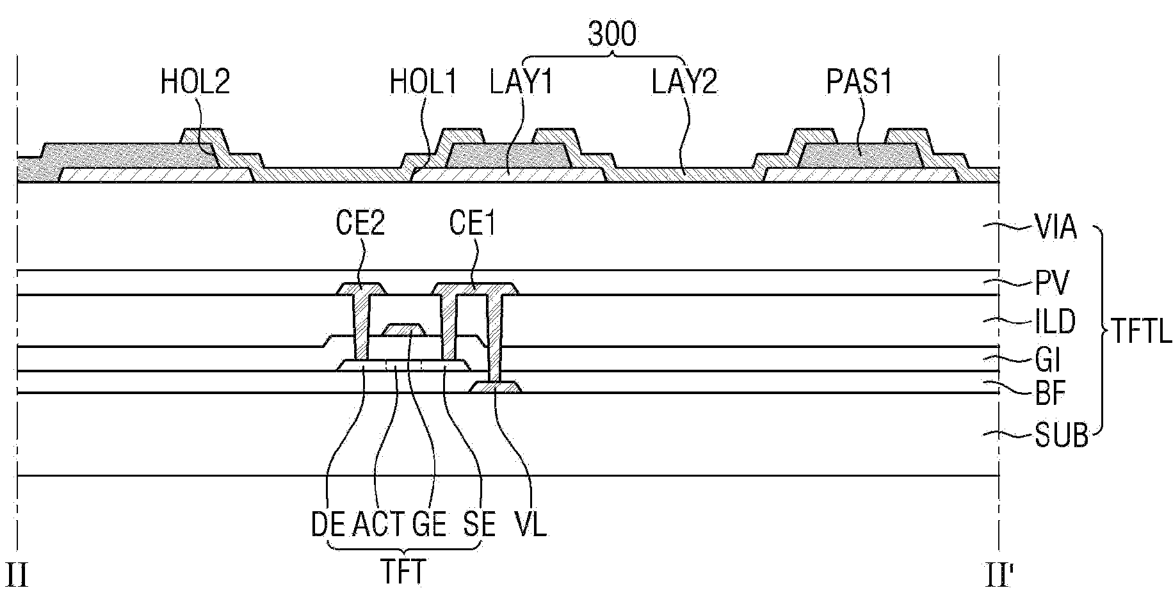
FIG. 18 is a cross-sectional view taken along the line II-II' of FIG. 16.

FIG. 16 is a plan view illustrating a protective metal layer of a display device according to yet one or more other embodiments, FIG. 17 is a plan view illustrating a second layer of a protective metal layer in a display device of FIG. 16, and FIG. 18 is a cross-sectional view taken along the line II-II' of FIG. 16.

Referring to FIGS. 16 to 18, the protective metal layer 300 may include a first layer LAY1 and a second layer LAY2. The second layer LAY2 of the protective metal layer 300 may be located in the fifth metal layer MTL5. Accordingly, the second layer LAY2 of the protective metal layer 300 may be formed of the same material as the first to fifth contact electrodes CTE1, CTE2, CTE3, CTE4, and CTE5 of the pixel SP in the same process.

The second layer LAY2 of the protective metal layer 300 may include a plurality of island electrodes. The second layers LAY2 of the protective metal layer 300 may be spaced apart from each other in a first direction (X-axis direction) and a second direction (Y-axis direction). The island electrodes of the second layer LAY2 may respectively overlap first holes HOL1 and second holes HOL2. The second layer LAY2 of the protective metal layer 300 may completely cover the first hole HOL1 and the second hole HOL2. The second layer LAY2 of the protective metal layer 300 may cover a part of the upper surface of the first layer LAY1 adjacent to the first hole HOL1, and a portion of the upper surface of the first insulating layer PAS1 adjacent to the second hole HOL2. The second layer LAY2 may be inserted into the second hole HOL2 of the first insulating layer PAS1, may be connected to the first layer LAY1, and may be inserted into the first hole HOL1 of the first layer LAY1 to be in contact with the upper surface of the via layer VIA. The plurality of island electrodes of the second layer LAY2 may be electrically connected through the first layer LAY1. Accordingly, the protective metal layer 300 may cover the entire surface of the gate driver 260 through the first and second layers LAY1 and LAY2, and may protect the gate driver 260 from static electricity.

The first layer LAY1 of the protective metal layer 300 may be connected to the power connection line VCL through an eighth contact hole CNT8. Here, the eighth contact hole CNT8 may pass through at least the via layer VIA and the protective layer PV. The first layer LAY1 of the protective metal layer 300 may receive a power voltage through the power connection line VCL. For example, the first layer LAY1 may supply the low potential voltage received from the power connection line VCL to the second layer LAY2. The power connection line VCL may be located in at least one of the first to third metal layers MTL1, MTL2, or MTL3, but is not limited thereto.

What is claimed is:

1. A display device comprising:
- a display area for displaying an image;
- a non-display area at least partially surrounding the display area;
- a pixel circuit in the display area, and comprising a thin film transistor;
- a gate driver in the non-display area for supplying a gate signal to the pixel circuit;
- a via layer above the pixel circuit and the gate driver;
- first and second electrodes above the via layer in the display area, and extending substantially in parallel with each other;
- a light-emitting element between the first electrode and the second electrode;
- a first contact electrode connected to one end of the light-emitting element; and
- a protective metal layer overlapping the gate driver, and comprising:
  - a first layer at a same layer as the first electrode and the second electrode, the first layer defining first holes; and
  - a second layer at a same layer as the first contact electrode, at least partially filling the first holes, and contacting an upper surface of the via layer.

2. The display device of claim 1, further comprising an insulating layer above the first layer of the protective metal layer, and defining second holes overlapping the first holes.

3. The display device of claim 2, wherein the second layer at least partially fills the second holes, and is connected to the first layer.

4. The display device of claim 1, wherein the second layer comprises a first portion extending in a first direction, and a second portion extending in a second direction crossing the first direction, and
- wherein a crossing region of the first portion and the second portion overlaps one of the first holes.

5. The display device of claim 4, further comprising a power connection line for supplying a power voltage to the second layer,
- wherein the second layer at least partially fills a contact hole passing through the via layer, and is connected to the power connection line.

6. The display device of claim 1, wherein the second layer comprises:

first portions extending in a first direction; and second portions extending in a second direction crossing the first direction, and connected to first ends of the first portions and to second ends of the first portions opposite to the first ends.

7. The display device of claim 6, wherein the second portions overlap respective portions of the first holes at a first side edge of the first layer and at a second side edge of the first layer, and wherein the first portions of the second layer overlap other respective portions of the first holes.

8. The display device of claim 1, wherein the second layer comprises a common electrode at least partially filling the first holes.

9. The display device of claim 1, wherein the second layer comprises island electrodes electrically connected to each other through the first layer.

10. The display device of claim 9, further comprising a power connection line for supplying a power voltage to the first layer, wherein the first layer at least partially fills a contact hole passing through the via layer, and is connected to the power connection line.

11. A display device comprising:

a display area for displaying an image;

a non-display area at least partially surrounding the display area;

a pixel circuit in the display area, and comprising a thin film transistor;

a gate driver in the non-display area for supplying a gate signal to the pixel circuit;

a via layer above the pixel circuit and the gate driver;

a first layer of a protective metal layer above the via layer overlapping the gate driver, and defining first holes;

an insulating layer above the first layer of the protective metal layer, and defining second holes at least partially overlapping the first holes; and a second layer of the protective metal layer above the insulating layer, at least partially filling the second holes, connected to the first layer, at least partially filling the first holes, and contacting an upper surface of the via layer.

12. The display device of claim 11, wherein the first layer comprises a reflective electrode, and wherein the second layer comprises a transparent electrode.

13. The display device of claim 11, wherein an area of one of the second holes is greater than an area of one of the first holes in plan view.

14. The display device of claim 11, wherein the first and second layers of the protective metal layer cover an entirety of portions of the upper surface of the via layer overlapping the gate driver.

15. The display device of claim 11, wherein the second layer covers at least a portion of an upper surface of the first layer adjacent to one of the first holes, and covers at least a portion of an upper surface of the insulating layer adjacent to one of the second holes.

16. A display device comprising:

a display area comprising a pixel comprising a first transistor;

a non-display area at least partially surrounding the display area, and comprising a gate driver for generating a gate signal;

a first voltage line above a first metal layer for supplying a high potential voltage to the first transistor of the pixel, the first transistor comprising:

a drain electrode in an active layer of the first metal layer, and electrically connected to the first voltage line;

an active region adjacent to the drain electrode;

a source electrode adjacent to the active region; and a gate electrode in a second metal layer above the active layer;

an anode connection electrode in a third metal layer above the second metal layer, and electrically connected to the source electrode of the first transistor;

a first electrode and a second electrode in a fourth metal layer above the third metal layer, and extending substantially in parallel to each other;

a light-emitting element between the first electrode and the second electrode;

a first contact electrode in a fifth metal layer above the fourth metal layer, and connected to one end of the light-emitting element; and a protective metal layer overlapping the gate driver, and comprising a first layer in the fourth metal layer that defines first holes, and a second layer in the fifth metal layer that at least partially fills the first holes.

17. The display device of claim 16, further comprising an insulating layer above the first layer of the protective metal layer, and defining second holes at least partially overlapping the first holes.

18. The display device of claim 17, wherein the second layer at least partially fills the second holes, and is connected to the first layer.

19. The display device of claim 17, wherein an area of one of the second holes is greater than an area of one of the first holes in plan view.

20. The display device of claim 16, further comprising a power connection line in at least one of the first metal layer, the second metal layer, or the third metal layer for supplying a power voltage to the protective metal layer.

* * * * *